(12) United States Patent
Tanaka

(10) Patent No.: US 11,601,203 B2
(45) Date of Patent: Mar. 7, 2023

(54) TRANSIMPEDANCE AMPLIFIER FOR RECEIVING BURST OPTICAL SIGNAL

(71) Applicant: SUMITOMO ELECTRIC INDUSTRIES, LTD., Osaka (JP)

(72) Inventor: Keiji Tanaka, Osaka (JP)

(73) Assignee: Sumitomo Electric Industries, Ltd., Osaka (JP)

( * ) Notice: Subject to any disclaimer, the term of this patent is extended or adjusted under 35 U.S.C. 154(b) by 0 days.

(21) Appl. No.: 17/488,204

(22) Filed: Sep. 28, 2021

(65) Prior Publication Data
US 2022/0109507 A1 Apr. 7, 2022

(30) Foreign Application Priority Data

Oct. 2, 2020 (JP) .............................. JP2020-167629

(51) Int. Cl.
H04B 10/69 (2013.01)
H04B 10/66 (2013.01)
H04B 10/25 (2013.01)
H03F 3/08 (2006.01)

(52) U.S. Cl.
CPC ............... H04B 10/66 (2013.01); H03F 3/08 (2013.01); H04B 10/25 (2013.01); H04B 10/69 (2013.01)

(58) Field of Classification Search
USPC ................................................. 398/202–213
See application file for complete search history.

(56) References Cited

U.S. PATENT DOCUMENTS

| 9,577,753 | B2* | 2/2017 | Sugimoto | H04B 10/6933 |
| 10,819,425 | B2* | 10/2020 | Tanaka | H04B 10/66 |
| 2003/0202802 | A1* | 10/2003 | Doh | H04L 25/062 |
| | | | | 398/202 |
| 2003/0206744 | A1* | 11/2003 | Doh | H03G 3/3047 |
| | | | | 398/209 |
| 2010/0231295 | A1* | 9/2010 | Hara | H03F 3/72 |
| | | | | 330/185 |
| 2011/0316622 | A1* | 12/2011 | Hara | H03G 3/3084 |
| | | | | 330/127 |

(Continued)

FOREIGN PATENT DOCUMENTS

| JP | 2010-213128 A | 9/2010 |
| JP | 2012-010107 A | 1/2012 |

(Continued)

Primary Examiner — Li Liu
(74) Attorney, Agent, or Firm — Volpe Koenig

(57) ABSTRACT

A transimpedance amplifier includes a feedback circuit that generates a bypass current in accordance with a charging voltage of a capacitor based on a difference between a voltage signal and a reference voltage signal, a differential amplifier circuit that generates a differential signal in accordance with the difference between the voltage signal and the reference voltage signal, and a detector circuit that resets the charging voltage of the capacitor in response to a detection of end of a burst optical signal. The feedback circuit detects start of the burst optical signal based on the charging voltage, maintains a time constant at a first time constant for a predetermined period from the detection of the start of the burst optical signal, and, upon an elapse of the predetermined period, switches the time constant from the first time constant to a second time constant larger than the first time constant.

9 Claims, 17 Drawing Sheets

(56) References Cited

U.S. PATENT DOCUMENTS

| | | | |
|---|---|---|---|
| 2012/0032740 A1* | 2/2012 | Hara | H03G 3/3084 |
| | | | 330/252 |
| 2015/0270808 A1* | 9/2015 | Sugimoto | H03F 3/45475 |
| | | | 330/294 |
| 2017/0294970 A1* | 10/2017 | Mita | H04B 10/616 |
| 2020/0014463 A1 | 1/2020 | Tanaka | |

FOREIGN PATENT DOCUMENTS

| | | |
|---|---|---|
| JP | 2012-060436 A | 3/2012 |
| JP | 2020-010202 A | 1/2020 |
| JP | 2020-010203 A | 1/2020 |
| WO | 2016/035374 A1 | 3/2016 |

* cited by examiner

TRANSIMPEDANCE AMPLIFIER FOR RECEIVING BURST OPTICAL SIGNAL

CROSS-REFERENCE TO RELATED APPLICATIONS

This application claims priority based on Japanese Patent Application No. 2020-167629, filed on Oct. 2, 2020, and the entire contents of which are incorporated herein by reference.

TECHNICAL FIELD

The present disclosure relates to a transimpedance amplifier.

BACKGROUND

In Ethernet (registered trademark) Passive Optical Network (EPON) which is an optical access system, a transimpedance amplifier is used in an optical receiver of an Optical Line Terminal (OLT). The optical receiver of the OLT receives burst optical signals from a plurality of Optical Network Units (ONUs) by Time Division Multiplexing (TDM). The ONUs each are away from the OLT by different distances. Thus, a transmission line loss from each ONU to the OLT varies in accordance with the distance. Thus, for example, a signal strength of a burst optical signal from an ONU located at a relatively near distance from the OLT is high and a signal strength of a burst optical signal from an ONU located at a farther distance from the OLT than the relatively near ONU is low. In this manner, burst optical signals having various signal strengths are input to the optical receiver of the OLT. Thus, the transimpedance amplifier included in the optical receiver of the OLT includes a feedback circuit which draws (subtracts) a bypass current from a current signal in accordance with a burst optical signal so as to receive burst optical signals having various signal strengths.

SUMMARY

A transimpedance amplifier according to one aspect of the present disclosure converts an input current generated by a photodetector in accordance with a burst optical signal to a differential signal including a positive-phase component and a negative-phase component and outputs the differential signal. The transimpedance amplifier includes: an input terminal configured to receive the input current; a single-ended amplifier circuit that has an input node electrically connected to the input terminal and is configured to convert a current signal input to the input node into a voltage signal; a first feedback circuit that has a time constant and is configured to generate a bypass current at a response speed adjusted by the time constant; a differential amplifier circuit configured to generate the differential signal in accordance with a difference between the voltage signal and a reference voltage signal; and a first detector circuit configured to detect an end of the burst optical signal on the basis of the differential signal. The first feedback circuit includes a capacitor, generates the bypass current in accordance with a charging voltage of the capacitor based on the difference between the voltage signal and the reference voltage signal, and subtracts the bypass current from the input current. The first feedback circuit detects a start of the burst optical signal on the basis of the charging voltage, maintains the time constant at a first time constant for a predetermined period from the detection of the start of the burst optical signal, and, upon an elapse of the predetermined period, switches the time constant from the first time constant to a second time constant that is larger than the first time constant. The first detector circuit resets the charging voltage of the capacitor by releasing electric charge stored in the capacitor in response to the detection of the end of the burst optical signal.

DETAILED DESCRIPTION

Hereinbelow, concrete examples of a transimpedance amplifier according to embodiments of the present disclosure will be described with reference to the drawings. Note that the present invention is not limited to the following examples, and it is intended that the present invention is defined by the claims and includes all changes within the meaning and range equivalent to the claims.

Figure 1:
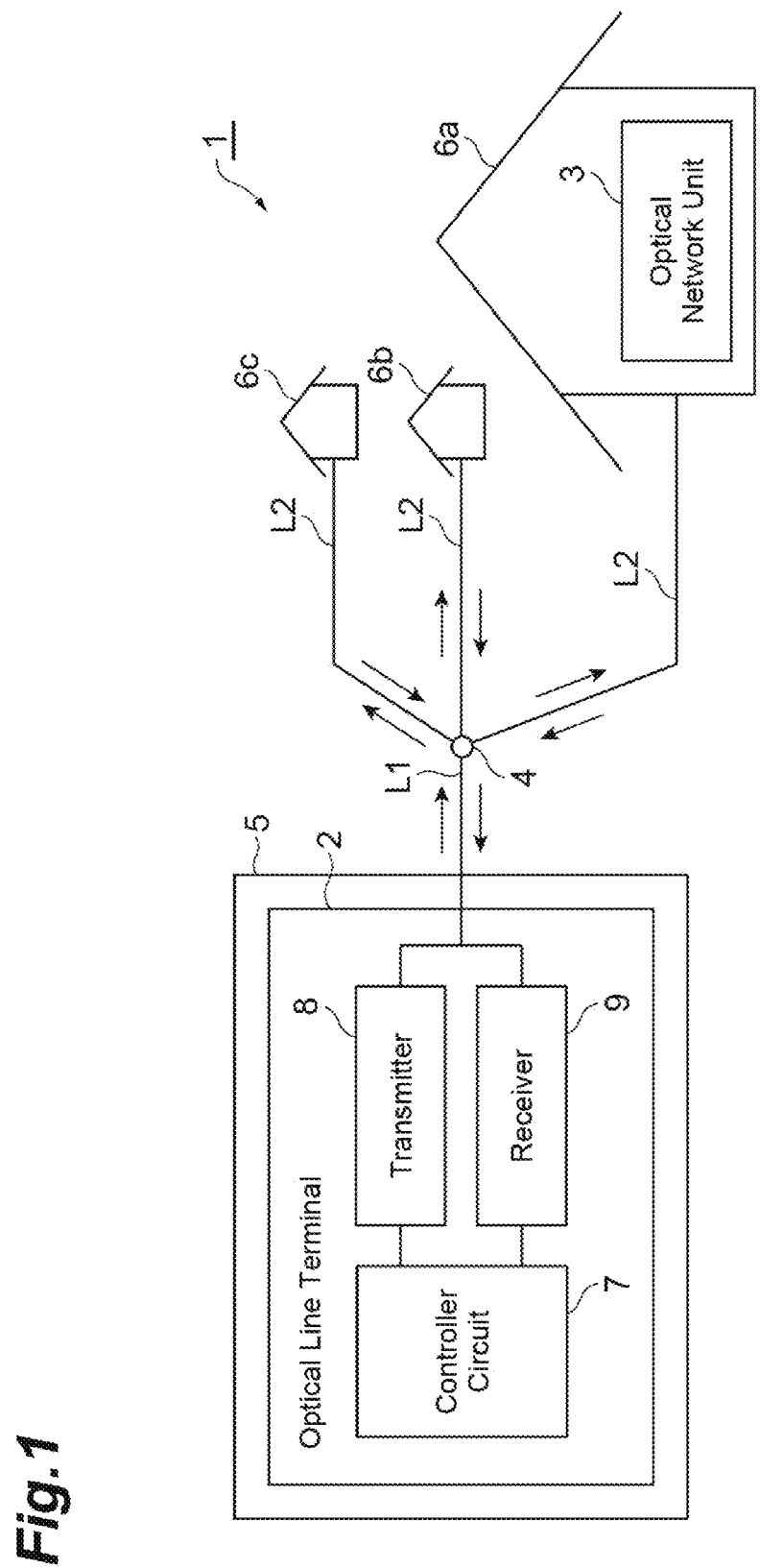
FIG. 1 is a block diagram illustrating a PON communication system.

First, a Passive Optical Network (PON) communication system will be described as an example of an optical access system including a transimpedance amplifier according to an embodiment of the present disclosure. FIG. 1 is a block diagram illustrating a PON communication system. A communication system 1 illustrated in FIG. 1 includes an OLT 2, a plurality of ONUs 3, an optical splitter 4, a communication path L1, and a plurality of communication paths L2.

OLT 2 installed inside a station 5 is connected to ONUs 3 installed inside each of a plurality of (three in the present embodiment) homes 6a to 6c through communication paths L1 and L2. Communication paths L1 and L2 are constituted by optical fiber cables. In FIG. 1, ONUs 3 installed inside home 6b and home 6c are not illustrated. OLT 2 and optical splitter 4 are connected through one communication path L1. Optical splitter 4 and each of ONUs 3 are connected through communication path L2.

Optical splitter 4 splits an optical signal (downstream signals) output to communication path L1 from OLT 2 and outputs the split optical signals to the respective communication paths L2. The optical signal output to each of communication paths L2 from optical splitter 4 is input to ONUs 3. Optical splitter 4 couples optical signals (upstream signals) output to communication paths L2 from ONUs 3 and outputs the coupled optical signal to communication path L1. The optical signal output to communication path L1 from optical splitter 4 is input to OLT 2.

OLT 2 includes a controller circuit 7, a transmitter 8, and a receiver 9. Transmitter 8 is a transmitter circuit that transmits an optical signal (downstream signal) to each of ONUs 3. Receiver 9 is a receiver circuit that receives an optical signal (upstream signal) from each of ONUs 3. Controller circuit 7 is a circuit that controls transmitter 8 and receiver 9. The optical signal (downstream signal) transmitted from transmitter 8 and the optical signal (upstream signal) received by receiver 9 have different peak wavelengths from each other. Since the downstream signal and the upstream signal have different peak wavelengths from each other, both signals can be transmitted by one optical fiber cable.

Figure 2:
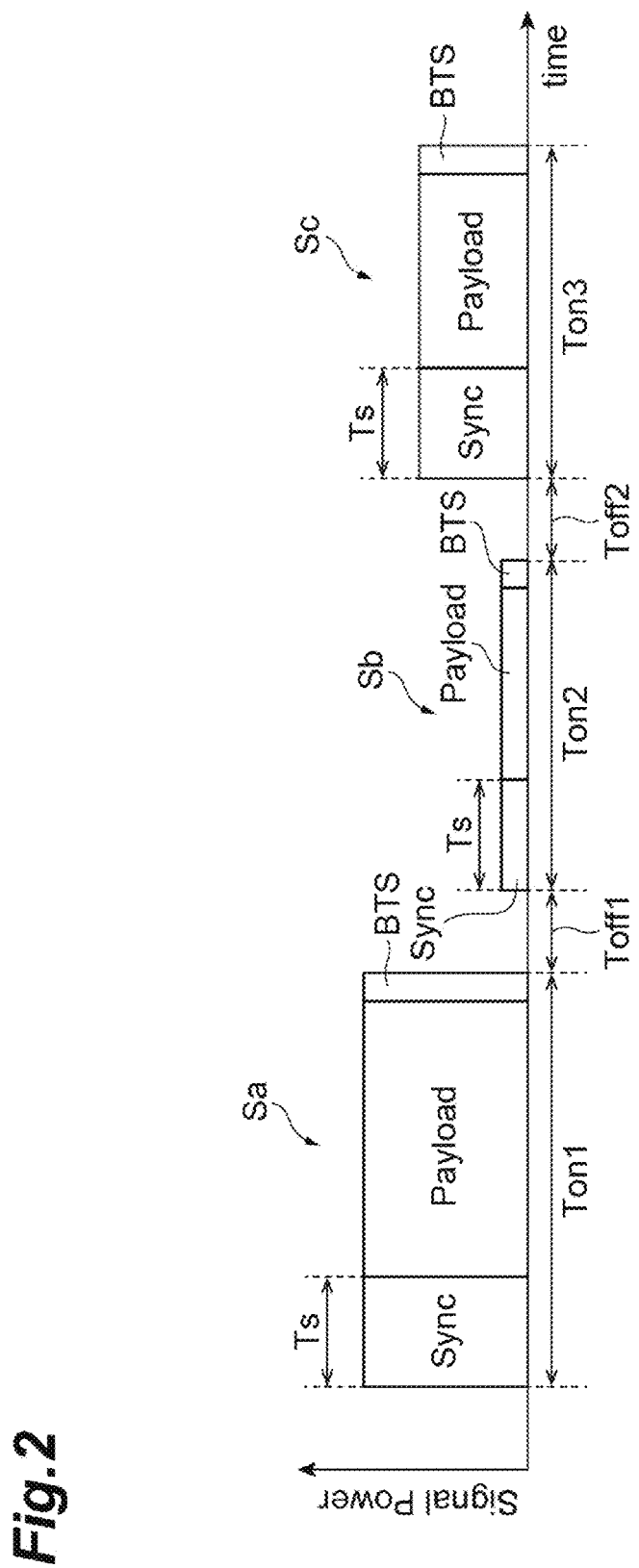
FIG. 2 is a schematic diagram illustrating changes with time in an optical signal input to an OLT.

FIG. 2 is a schematic diagram illustrating a timing chart of an optical signal input to the OLT. As illustrated in FIG. 2, the optical signal input to receiver 9 of OLT 2 includes intermittent burst optical signals Sa to Sc. In other words, burst optical signals Sa to Sc are intermittently input to receiver 9. In the present embodiment, burst optical signal Sa, burst optical signal Sb, and burst optical signal Sc are input to receiver 9 in this order. Burst optical signals Sa to Sc are input to receiver 9 during periods Ton1 to Ton3, respectively.

Specifically, burst optical signal Sa output from ONU 3 installed in home 6a is input to receiver 9 during period Ton1. That is, a period from a starting time of reception of burst optical signal Sa to an ending time of the reception of burst optical signal Sa corresponds to period Ton1. Burst optical signal Sb output from ONU 3 installed in home 6b is input to receiver 9 during period Ton2. That is, a period from a starting time of reception of burst optical signal Sb to an ending time of the reception of burst optical signal Sb corresponds to period Ton2. Burst optical signal Sc output from ONU 3 installed in home 6c is input to receiver 9 during period Ton3. That is, a period from a starting time of reception of burst optical signal Sc to an ending time of the reception of burst optical signal Sc corresponds to period Ton3.

For example, during period Ton1, when ONU 3 installed in home 6a outputs burst optical signal Sa, ONU 3 installed in home 6b and ONU 3 installed in home 6c do not output the burst optical signal. That is, only one ONU 3 installed in any one of homes 6a, 6b, and 6c outputs the burst optical signal during a certain period, and the other ONUs 3 do not output the burst optical signals. ONU 3 installed in each of homes 6a, 6b, and 6c transmits the burst optical signal by time division multiplexing.

Each of burst optical signals Sa to Sc includes a preamble signal (Sync in FIG. 2) and a payload signal (Payload in FIG. 2) following the preamble signal. The preamble signal is a signal for stabilizing an output signal from an amplifier circuit included in receiver 9 while the preamble signal is input to receiver 9. For example, the preamble signal is a bit stream in which an arrangement of 0's or 1's is fixed. A period Ts during which the preamble signal included in each of burst optical signals Sa to Sc is input to receiver 9 is substantially equal between burst optical signals Sa to Sc. Period Ts is set to, for example, a certain time. Period Ts is a settling time necessary for receiver 9 to enter a state in which the payload signal of each of burst optical signals Sa to Sc can be normally received. In other words, it is necessary for receiver 9 to complete a preparation for normally receiving the payload signal within period Ts (within the settling time).

In receiver 9, for example, an optical signal is converted to an electric signal, and the electric signal is input to an amplifier circuit. The signal processor which is connected to a stage subsequent to the amplifier circuit processes the electric signal amplified by the amplifier circuit. In the signal processor, the payload signal is used in order to correctly regenerate the optical signal output from each of ONUs 3 while correcting shifts in frequency and phase of the optical signal. Thus, it is desired to achieve control (stabilization) of the burst optical signal in the amplifier circuit of receiver 9 at the highest possible speed. That is, it is desired that a transimpedance amplifier 10 (described below) which constitutes the amplifier circuit of receiver 9 appropriately detects a start (rising) and an end (falling) of the input of a current signal in accordance with the burst optical signal and eliminate an influence caused by the strength of the burst optical signal within period Ts.

The payload signal is a signal including data transmitted from each of ONUs 3. A period of the payload signal included in each of burst optical signals Sa to Sc varies in accordance with a data amount of the payload signal. Therefore, the lengths of periods Ton1 to Ton3 are different from each other. Each of burst optical signals Sa to Sc may include a burst termination signal (BTS) following the payload signal. The BTS indicates the end of the burst optical signal.

Each of burst optical signals Sa to Sc is a signal that changes between a high-level and a low-level of signal strength (optical power). In other words, in each of burst optical signals Sa to Sc, the high-level and low-level signals are arranged in a mixed manner with respect to time. For example, the high-level optical signal has a predetermined signal strength, and the low-level signal has a signal strength substantially equal to zero. For example, the high-level corresponds to logical value 1 of binary data, and the low-level corresponds to logical value 0 of binary data. For example, in the preamble signal, the high-level signal and the low-level signal are regularly and alternately repeated. The payload signal includes an irregular arrangement of high-level and low-level signals in accordance with communication data transmitted from each of homes 6a and 6b.

During a period Toff1, no optical signal is input to the receiver 9. A period from the ending time of the reception of burst optical signal Sa to the starting time of the reception of burst optical signal Sb corresponds to period Toff1. During a period Toff2, no optical signal is input to the receiver 9. A period from the ending time of the reception of burst optical signal Sb to the starting time of the reception of burst optical signal Sc corresponds to period Toff2. Periods Toff1 and Toff2 are periods (interval periods) for switching the communication path L2.

Since distances between OLT 2 and the respective ONUs 3 differ from each other, losses of optical signals generated in the respective communication paths L2 differ from each other. Thus, for example, even when the amplitudes (the differences between the high-level and the low-level) of burst optical signals Sa to Sc output from ONU 3 are substantially the same, burst optical signals Sa to Sc input to receiver 9 have different amplitudes due to the loss in communication path L2. In this manner, optical signals (burst optical signals) which are output from different homes and have different amplitudes are input to receiver 9 by time division multiplexing. In the amplifier circuit of receiver 9, since the amplitudes of the sequentially received burst optical signals are different from each other, a feedback circuit is used.

In a transimpedance amplifier for an optical receiver of an OLT, it is desirable that the transimpedance amplifier can respond to an intermittent burst optical signal at a high speed and that a feedback circuit stably operates with respect to consecutive identical digits (CID) in the burst optical signal (consecutive identical digits tolerance). In the feedback circuit, the time constant of the feedback circuit at the start of input of a current signal in accordance with the burst optical signal is set to a small value so that the output voltage of the amplifier is quickly stabilized (averaged) by a quick response. On the other hand, when a predetermined time has elapsed from the start of the input, the time constant is switched to a value larger than the time constant at the start of the input in order to respond to the consecutive identical digits. Further, after one burst optical signal ends, the time constant is set again to the small value which is at the start of input in preparation for the next burst optical signal.

The switching of these time constants is performed by comparing the voltage value of the control signal obtained by amplifying the difference between the mean value of the output voltage of the amplifier and a first reference voltage with a second reference voltage. The amount of change per time of the control signal depends on the value of the time constant of the feedback circuit. For example, since the time constant of the feedback circuit is set to a large value at the time point when the input of the current signal in accordance with one burst optical signal ends, the change per time of the control signal is relatively small with respect to the change per time of the output voltage of the amplifier. Therefore, since it takes time until the control signal (voltage value) becomes larger than the value of the second reference voltage, it takes a relatively long time until the time constant of the feedback circuit is set again to the small value which is at the start of input. As a result, since it takes time for the mean value of the output voltage of the amplifier to return to the initial state in which the current signal in accordance with the burst optical signal is not input, a long interval period is required from the end of reception of one burst optical signal to the start of reception of the next burst optical signal.

The present disclosure describes a transimpedance amplifier that can normally receive a next burst optical signal even when an interval period from the end of reception of one burst optical signal to the start of reception of the next burst optical signal is short.

Figure 3:
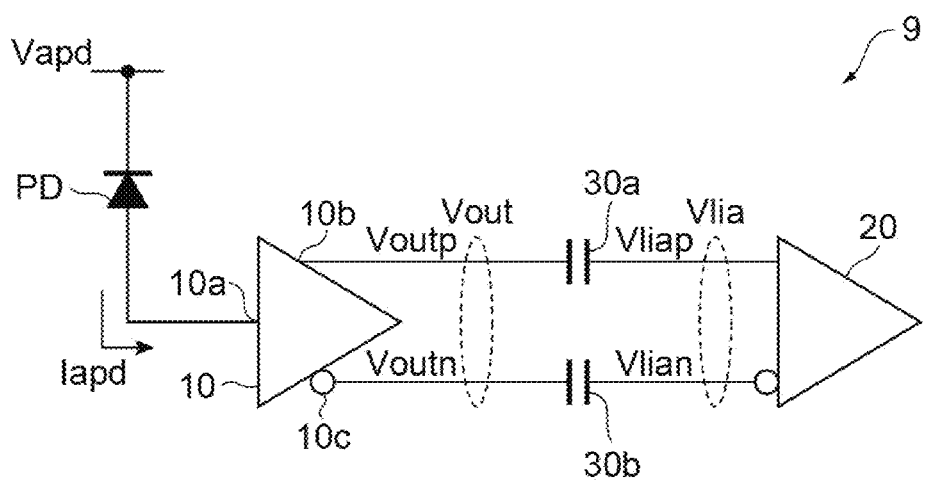
FIG. 3 is a diagram illustrating a configuration example of a receiver illustrated in FIG. 1.

Next, the configuration of receiver 9 of OLT 2 will be described. FIG. 3 is a diagram illustrating a configuration example of the receiver illustrated in FIG. 1. Receiver 9 is, for example, a 10G-EPON optical receiver. Receiver 9 includes a photodetector PD, a transimpedance amplifier (TIA) 10, and a limiting amplifier (LIA) 20.

Photodetector PD is an element that converts a burst optical signal input to receiver 9 to an electric signal (current signal). For example, photodetector PD is an avalanche-photodiode (APD). Specifically, photodetector PD generates an input current Iapd including a direct current (DC) component as a current signal in accordance with the signal strength (optical power) of the intermittent burst optical signal.

Photodetector PD generates input current Iapd in accordance with the optical power of the burst optical signal. For example, as the optical power of the burst optical signal increases, input current Iapd increases. For example, when a high-level burst optical signal is input to receiver 9, photodiode PD generates input current Iapd having a magnitude corresponding to the high-level optical power. For example, when a low-level burst optical signal is input to receiver 9, photodetector PD generates input current Iapd substantially equal to zero. Therefore, photodiode PD generates a high-level input current Iapd for a high-level burst optical signal and generates a low-level input current Iapd for a low-level burst optical signal. The amplitudes of the input currents Iapd generated by burst optical signals Sa to Sc are different from each other. Photodetector PD outputs the generated input current Iapd to transimpedance amplifier 10. In the present embodiment, a cathode of photodetector PD is electrically connected to an applied voltage Vapd, and an anode of photodetector PD is electrically connected to an input terminal 10a of transimpedance amplifier 10.

Transimpedance amplifier 10 is a circuit that converts and amplifies input current Iapd to generate a differential signal Vout as a voltage signal. Transimpedance amplifier 10 outputs differential signal Vout. Transimpedance amplifier 10 is configured as, for example, an integrated circuit (IC). Specifically, transimpedance amplifier 10 converts input current Iapd to differential signal Vout which includes a positive-phase component Voutp and a negative-phase component Voutn, and outputs differential signal Vout to limiting amplifier 20. Transimpedance amplifier 10 performs the amplification with a high gain when input current Iapd is relatively small and performs the amplification with a low gain when input current Iapd is relatively large. In this manner, transimpedance amplifier 10 controls a gain in accordance with the magnitude of input current Iapd. Details of transimpedance amplifier 10 will be described below.

Differential signal Vout is input to limiting amplifier 20 through capacitors 30a and 30b, for example. Transimpedance amplifier 10 and limiting amplifier 20 are alternating current (AC)-coupled by capacitors 30a and 30b. The capacitance of each of capacitors 30a and 30b is smaller than the capacitance of a capacitor used in a receiver for trunk line system in order to respond to a burst optical signal at a high speed. The receiver for trunk line system mainly receives continuous signals. For example, the capacitance of capacitor 30a and the capacitance of capacitor 30b are equal to each other. A DC component included in differential signal Vout is removed by the AC coupling, and differential signal Vout is input as a differential signal Vlia to limiting amplifier 20. Differential signal Vlia includes a positive-phase component Vliap and a negative-phase component Vlian. Positive-phase component Vliap is positive-phase component Voutp from which the DC component is removed, and negative-phase component Vlian is negative-phase component Voutn from which the DC component is removed.

Positive-phase component Vliap and negative-phase component Voutn have phases different from each other by 180°. For example, when positive-phase component Vliap increases, negative-phase component Voutn decreases, and when positive-phase component Vliap decreases, negative-phase component Voutn increases. For example, when positive-phase component Vliap reaches a peak value, negative-phase component Voutn reaches a bottom value, and when positive-phase component Vliap reaches a bottom value, negative-phase component Voutn reaches a peak value. Positive-phase component Vliap and negative-phase component Voutn may have the same amplitudes and the same mean values.

Limiting amplifier 20 is a circuit that converts differential signals having various strengths to voltage signals having a constant amplitude and outputs the voltage signals. Limiting amplifier 20 is configured as, for example, an IC. Limiting amplifier 20 equalizes voltage values of positive-phase component Vliap and negative-phase component Vlian which are input through capacitors 30a and 30b and output the voltage signals. In other words, limiting amplifier 20 saturation-amplifies the voltage difference between positive-phase component Vliap and negative-phase component Vlian. The voltage signal having a constant amplitude output from limiting amplifier 20 is input to a clock and data recovery (CDR, not illustrated) circuit. A clock signal is extracted from the voltage signal by the CDR circuit, and a data waveform is shaped by performing a regenerating process with the clock signal with low jitter. The CDR circuit is an example of the above-described signal processor. For example, although differential signal Vlia is an analog signal having high jitter, the signal (omitted in FIG. 3) output from the CDR circuit can be processed as a digital signal.

Figure 4:
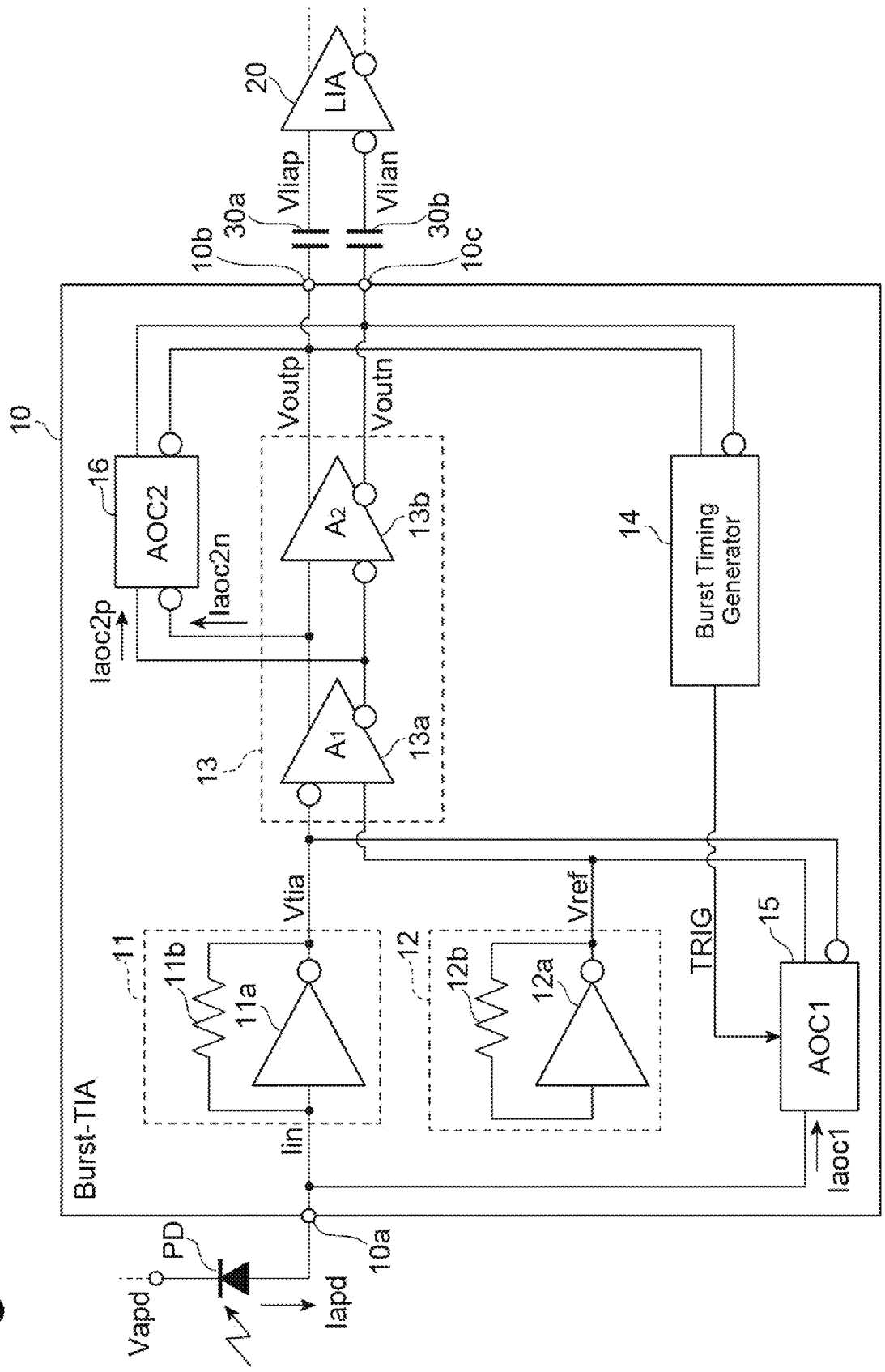
FIG. 4 is a block diagram illustrating a transimpedance amplifier according to an embodiment.

Next, details of the transimpedance amplifier 10 will be described. FIG. 4 is a block diagram illustrating the transimpedance amplifier according to the embodiment. Transimpedance amplifier 10 illustrated in FIG. 4 includes a TIA core 11 (single-ended amplifier), a reference voltage generator circuit 12, a differential amplifier circuit 13, a detector circuit 14 (first detector circuit), a feedback circuit 15 (first feedback circuit), and a feedback circuit 16 (second feedback circuit).

TIA core 11 is a single-ended amplifier (transimpedance amplifier) that converts a current signal Iin to a voltage signal Vtia. Specifically, TIA core 11 includes a voltage amplifier 11a and a feedback resistor element 11b. The input terminal and the output terminal of voltage amplifier 11a are electrically connected through feedback resistor element 11b. That is, feedback resistor element 11b is electrically connected between the input and the output of voltage amplifier 11a. Current signal Iin is obtained by subtracting a DC bypass current Iaoc1 from input current Iapd. The increase/decrease of voltage signal Vtia is inverted with respect to the increase/decrease of current signal Iin. For example, when current signal Iin increases, voltage signal Vtia decreases, and when current signal Iin decreases, voltage signal Vtia increases. Voltage amplifier 11a is, for example, an inverting amplifier circuit. TIA core 11 outputs voltage signal Vtia to differential amplifier circuit 13 (differential amplifier 13a) and feedback circuit 15. The gain (the ratio of the magnitude of voltage signal Vtia to the magnitude of current signal Iin) of TIA core 11 is determined by a resistance value (transimpedance) of feedback resistor element 11b.

Reference voltage generator circuit 12 is a circuit that generates a reference voltage signal Vref that is a direct current (DC) voltage signal. Reference voltage generator circuit 12 outputs reference voltage signal Vref to differential amplifier circuit 13 (differential amplifier 13a) and feedback circuit 15. Reference voltage signal Vref is used to convert a single voltage signal Vtia to differential signal Vout in differential amplifier circuit 13, and has a predetermined voltage value (constant value). For example, the voltage value of reference voltage signal Vref is set to the value of voltage signal Vtia when input current Iapd is zero. The voltage value of reference voltage signal Vref may be set to the value of voltage signal Vtia when input current Iapd is a predetermined positive value. In this case, the voltage value of reference voltage signal Vref becomes smaller than the value of voltage signal Vtia when input current Iapd is zero.

In the present embodiment, reference voltage generator circuit 12 has the same configuration as TIA core 11. Specifically, reference voltage generator circuit 12 is a dummy TIA including a voltage amplifier 12a and a feedback resistor element 12b. The input terminal and the output terminal of voltage amplifier 12a are electrically connected through feedback resistor element 12b. That is, feedback resistor element 12b is electrically connected between the input and the output of voltage amplifier 12a. Voltage amplifier 12a is, for example, an inverting amplifier circuit. Voltage amplifier 12a has, for example, the same electrical characteristics as voltage amplifier 11a. For example, voltage amplifier 12a has the same circuit configuration as voltage amplifier 11a, and the parameters of the circuit elements constituting the circuit are set to be the same. For example, feedback resistor element 12b has the same resistance value as the resistance value of feedback resistor element 11b. Since reference voltage generator circuit 12 has the same configuration as TIA core 11, reference voltage signal Vref can be generated so as to compensate (cancel) the change in voltage signal Vtia due to the change in power supply voltage and temperature of voltage amplifier 11a.

Differential amplifier circuit 13 is a circuit that generates differential signal Vout including positive-phase component Voutp and negative-phase component Voutn in accordance with a difference between voltage signal Vtia and reference voltage signal Vref. In other words, differential amplifier circuit 13 converts the single (single phase) voltage signal Vtia to differential signal Vout using reference voltage signal Vref. Differential amplifier circuit 13 includes, for example, differential amplifier 13a and differential amplifier 13b.

Differential amplifier 13a generates a differential signal by amplifying the difference between voltage signal Vtia and reference voltage signal Vref. Differential amplifier 13a outputs the generated differential signal to differential amplifier 13b. Differential amplifier 13b amplifies the differential signal output from differential amplifier 13a to generate differential signal Vout including positive-phase component Voutp and negative-phase component Voutn. Since differential amplifier circuit 13 includes two differential amplifiers 13a and 13b, voltage signal Vtia can be amplified with a higher gain. Differential amplifier circuit 13 (differential amplifier 13b) outputs differential signal Vout to limiting amplifier 20 through output terminals 10b and 10c of transimpedance amplifier 10. Further, differential amplifier circuit 13 outputs differential signal Vout to detector circuit 14 and feedback circuit 16.

In differential amplifier circuit 13, for example, differential amplifier 13a performs an inverting amplification, and differential amplifier 13b performs a non-inverting amplification. Therefore, as voltage signal Vtia becomes smaller than reference voltage signal Vref, positive-phase component Voutp increases and negative-phase component Voutn decreases. As voltage signal Vtia becomes larger than reference voltage signal Vref, positive-phase component Voutp decreases and negative-phase component Voutn increases. That is, as voltage signal Vtia becomes smaller than reference voltage signal Vref, differential signal Vout increases, and as voltage signal Vtia becomes larger than reference voltage signal Vref, differential signal Vout decreases.

Since TIA core 11 performs the inverting amplification, the logical value of the optical signal matches the logical value of differential signal Vout. That is, when the signal strength of the optical signal is high-level, differential signal Vout becomes high-level, and when the signal strength of the optical signal is low-level, differential signal Vout becomes low-level. In differential amplifier circuit 13, for example, differential amplifier 13a may perform a non-inverting amplification, and differential amplifier 13b may perform an inverting amplification. However, in this case, feedback circuit 16 is changed in accordance with the fact that differential amplifier 13b performs an inverting amplification.

Detector circuit 14 is a circuit that detects the end of the burst optical signal on the basis of differential signal Vout. Detector circuit 14 monitors the strength of the burst optical signal on the basis of the differential signal Vout and adjusts a control threshold. When a burst optical signal whose signal strength is smaller than that of the burst optical signal starts immediately after the end of the burst optical signal, detector circuit 14 detects the end of the preceding burst optical signal (that is, the timing at which the signal strength decreases). Detector circuit 14 is also referred to as a burst timing generator (BTG). In the present embodiment, detector circuit 14 detects the end of the burst optical signal on the basis of a peak value Vpn (second peak value) of negative-phase component Voutn and a peak value Vpp (first peak value) of positive-phase component Voutp. Specifically, detector circuit 14 detects the end of the burst optical signal upon detecting that peak value Vpn of negative-phase component Voutn is larger than a threshold Vth (first threshold). Threshold Vth is a threshold for detecting the end of the burst optical signal, and is generated in accordance with peak value Vpp of positive-phase component Voutp.

In response to the detection of the end of the burst optical signal, detector circuit 14 releases electric charge stored in capacitor 55 (see FIG. 12) of feedback circuit 15 to reset a charging voltage of capacitor 55. Specifically, detector circuit 14 outputs a trigger signal TRIG for resetting the charging voltage of capacitor 55 to feedback circuit 15 in response to detection of the end of the burst optical signal. Trigger signal TRIG is a binary signal including high-level and low-level states. Trigger signal TRIG is set to a low-level in an initial state in which input current Iapd in accordance with the burst optical signal is not input. That is, in the initial state, capacitor 55 in feedback circuit 15 is set to a chargeable state.

Upon detecting the end of the burst optical signal, detector circuit 14 changes trigger signal TRIG from a low-level to a high-level. When trigger signal TRIG maintained at a high-level is input to feedback circuit 15, the charging voltage of capacitor 55 is reset in feedback circuit 15. Then, detector circuit 14 changes trigger signal TRIG from a high-level to a low-level. As a result, in feedback circuit 15, capacitor 55 becomes a chargeable state.

Detector circuit 14 performs the above operation of switching trigger signal TRIG every time detector circuit 14 detects the end of the burst optical signal. Thus, when detector circuit 14 detects the end of the burst optical signal, detector circuit 14 resets the charging voltage of capacitor 55 of feedback circuit 15 by the operation of switching trigger signal TRIG. Details of detector circuit 14 will be described later.

Feedback circuit 15 is a circuit that generates bypass current Iaoc1 in accordance with the difference between a mean value (DC component) of voltage signal Vtia and reference voltage signal Vref. Voltage signal Vtia and reference voltage signal Vref are input to feedback circuit 15. Feedback circuit 15 generates bypass current Iaoc1 in accordance with the charging voltage of capacitor 55 based on the difference between voltage signal Vtia and reference voltage signal Vref. Specifically, feedback circuit 15 amplifies a low-frequency component including a DC component included in the voltage signal Vtia to generate bypass current Iaoc1. Feedback circuit 15 has a time constant and generates bypass current Iaoc1 at a response speed adjusted by the time constant. Feedback circuit 15 detects the start of the burst optical signal on the basis of the charging voltage of capacitor 55. Feedback circuit 15 maintains the time constant at a time constant $\tau 2$ (first time constant) for a predetermined period after detecting the start of the burst optical signal, and switches the time constant from time constant $\tau 2$ to time constant $\tau 1$ (second time constant) larger than the time constant $\tau 2$ after the predetermined period elapses.

An output terminal of feedback circuit 15 is connected to an input terminal of TIA core 11. Feedback circuit 15 generates bypass current Iaoc1. Since bypass current Iaoc1 flows from input terminal 10a toward feedback circuit 15, bypass current Iaoc1 is drawn from input current Iapd. In other words, feedback circuit 15 generates current signal Iin by subtracting bypass current Iaoc1 from input current Iapd.

Thus, a DC component included in input current Iapd is removed, and an AC component included in input current Iapd is input as current signal Iin to TIA core 11. By subtracting bypass current Iaoc1 from input current Iapd, the mean value (DC component) of voltage signal Vtia matches reference voltage signal Vref. Thus, a DC offset generated by input current Iapd in TIA core 11 is removed. As a result, even when the strength of the burst optical signal is relatively high and a voltage signal in accordance with input current Iapd has an amplitude limitation by saturation of a differential amplifier 13b, a change in the duty ratio of the voltage signal is reduced. Details of feedback circuit 15 will be described later.

Feedback circuit 16 is a circuit that removes a DC offset included in differential signal Vout by performing feedback control to differential amplifier circuit 13 in accordance with positive-phase component Voutp and negative-phase component Voutn. Even when the mean value of voltage signal Vtia is equal to the voltage value of reference voltage signal Vref, a DC offset may occur in differential amplifier circuit 13. Therefore, an amplified DC offset may occur in differential signal Vout. The DC offset included in differential signal Vout is a difference between the potential of a DC component included in positive-phase component Voutp and the potential of a DC component included in negative-phase component Voutn. A positive-phase output terminal and a negative-phase output terminal of feedback circuit 16 are connected to output resistor elements (not illustrated) of differential amplifier 13a, respectively.

Feedback circuit 16 operates so that the potential of the DC component included in positive-phase component Voutp and the potential of the DC component included in negative-phase component Voutn become equal to each other. Specifically, feedback circuit 16 amplifies the difference between low-frequency components including the DC component included in positive-phase component Voutp and negative-phase component Voutn to generate bypass currents Iaoc2p and Iaoc2n in accordance with the difference. Feedback circuit 16 has a configuration similar to the configuration of a known feedback circuit. Thus, detailed description of the configuration of feedback circuit 16 will be omitted. The potential of the DC component included in the differential signal output from differential amplifier 13a is adjusted by feedback control performed by feedback circuit 16, and the mean value of the voltage of the differential signal Vout becomes substantially equal to zero. Differential signal Vout corresponds to the difference (Voutp−Voutn) between positive-phase component Voutp and negative-phase component Voutn.

Figure 5:
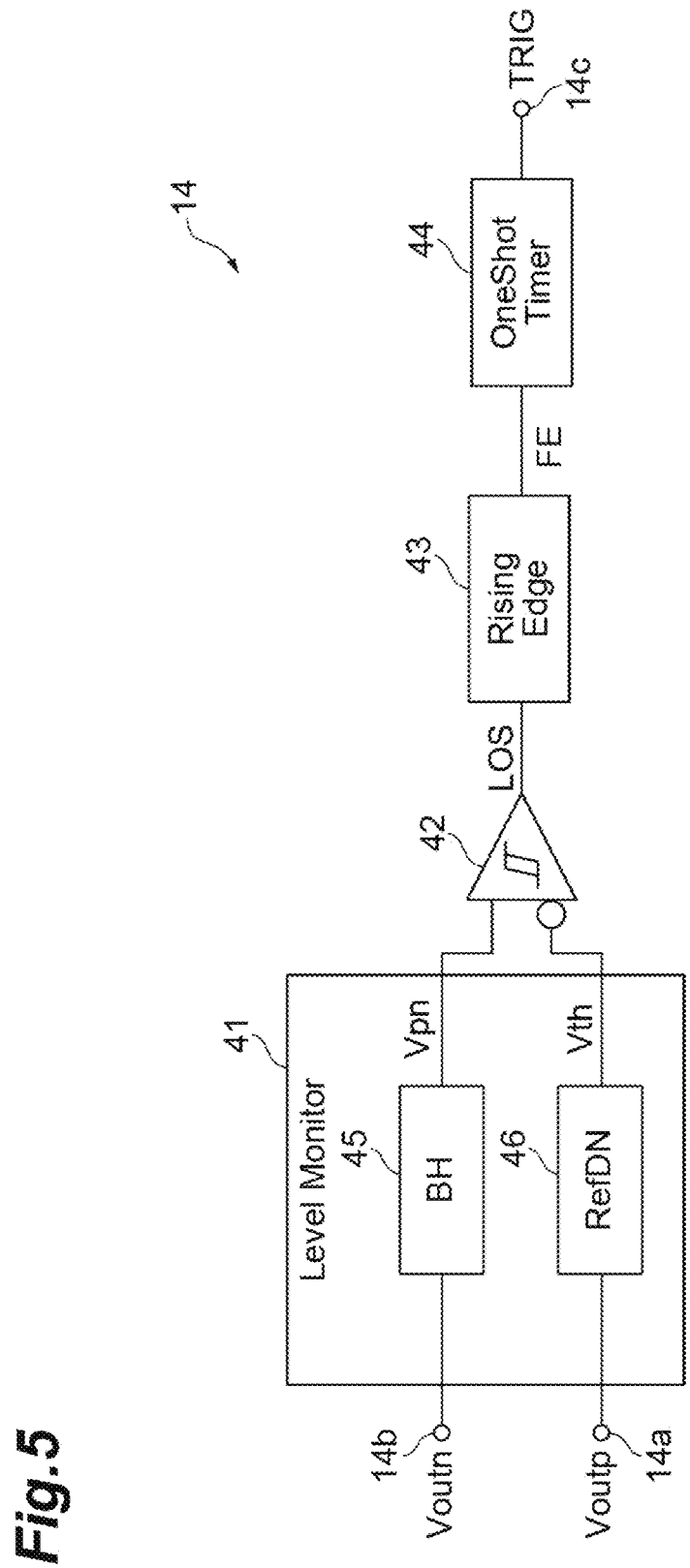
FIG. 5 is a block diagram illustrating a detector circuit illustrated in FIG. 4.
Figure 6:
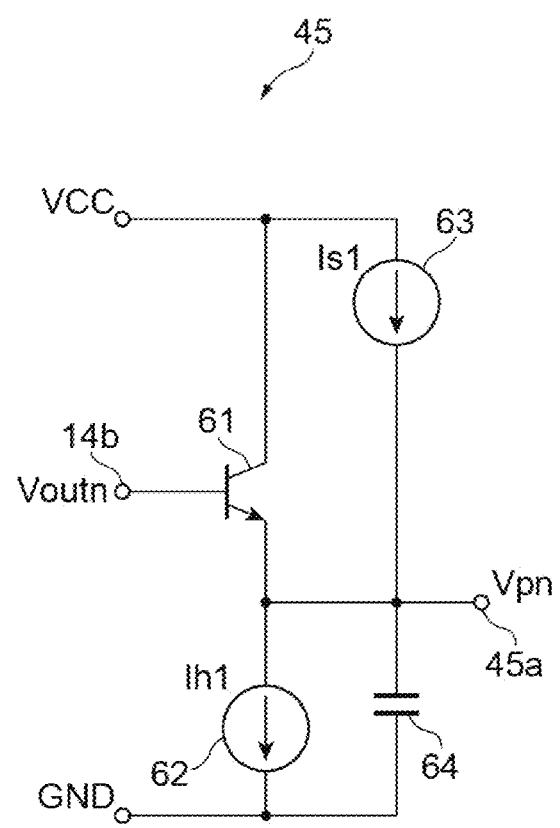
FIG. 6 is a circuit diagram illustrating a single-phase peak-hold circuit illustrated in FIG. 5.
Figure 7:
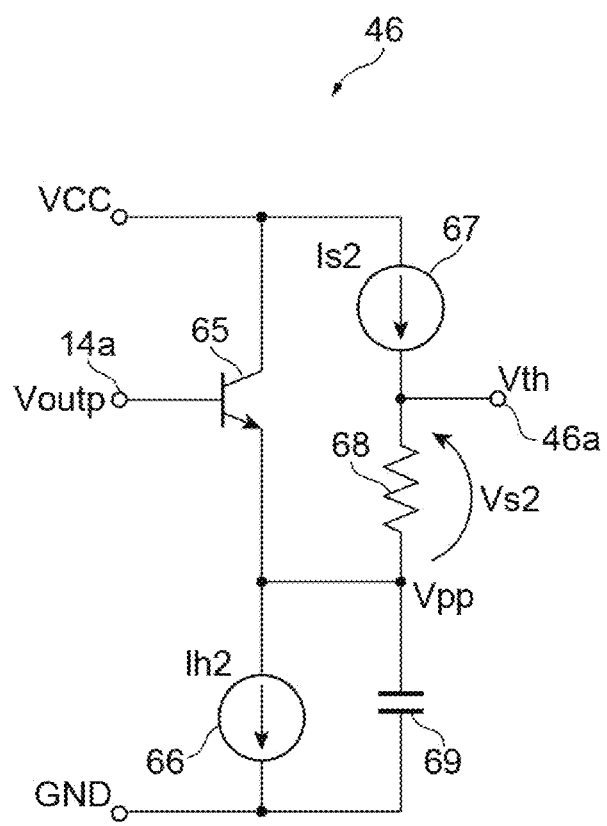
FIG. 7 is a circuit diagram illustrating a threshold generator circuit illustrated in FIG. 5.
Figure 8:
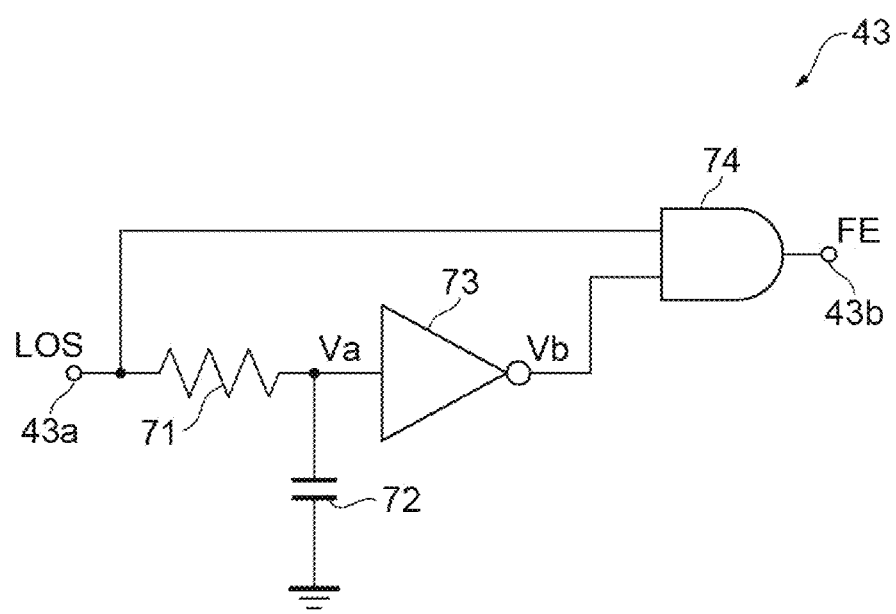
FIG. 8 is a circuit diagram illustrating an edge detector circuit illustrated in FIG. 5.
Figure 9:
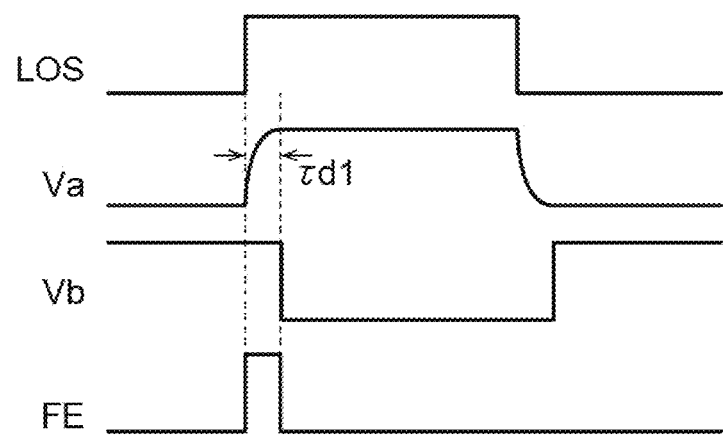
FIG. 9 is a timing chart illustrating the operation of the edge detector circuit illustrated in FIG. 8.
Figure 10:
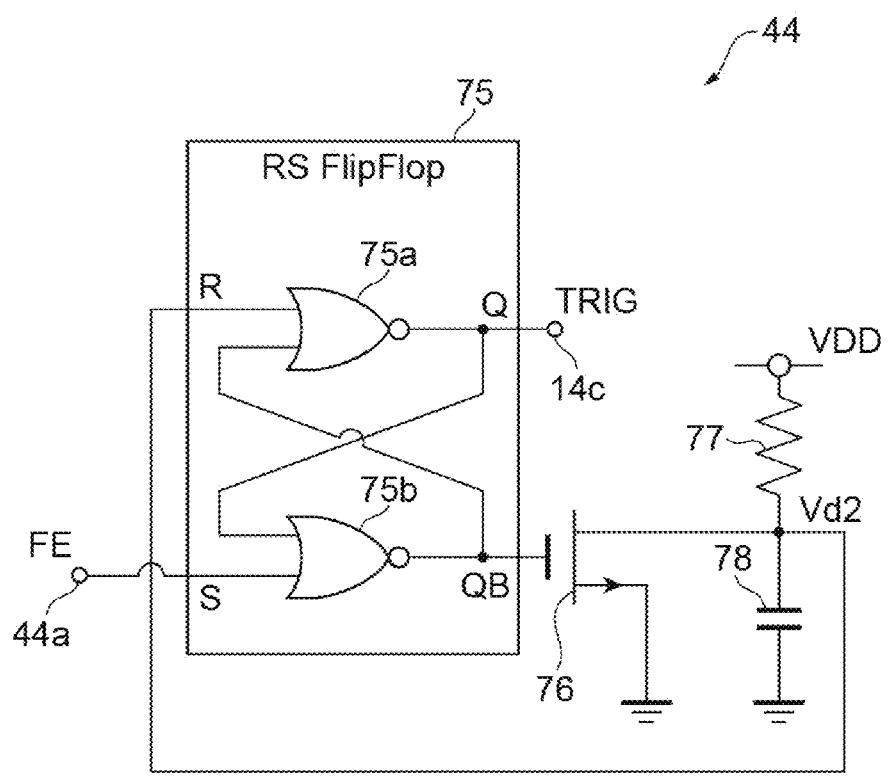
FIG. 10 is a circuit diagram illustrating a trigger signal generator circuit illustrated in FIG. 5.
Figure 11:
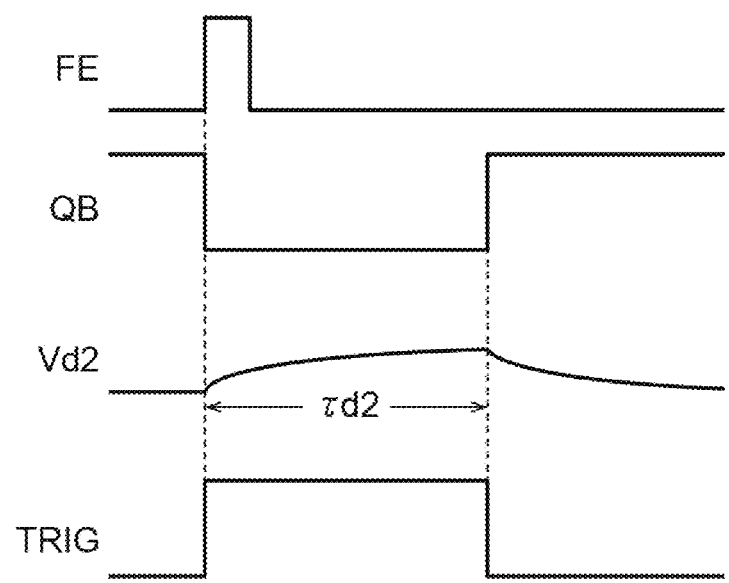
FIG. 11 is a timing chart illustrating the operation of the trigger signal generator circuit illustrated in FIG. 10.

Next, details of detector circuit 14 will be described with reference to FIGS. 5 to 11. FIG. 5 is a block diagram illustrating the detector circuit illustrated in FIG. 4. FIG. 6 is a circuit diagram illustrating the single-phase peak-hold circuit illustrated in FIG. 5. FIG. 7 is a circuit diagram illustrating the threshold generator circuit illustrated in FIG. 5. FIG. 8 is a circuit diagram illustrating the edge detector circuit illustrated in FIG. 5. FIG. 9 is a timing chart illustrating the operation of the edge detector circuit illustrated in FIG. 8. FIG. 10 is a circuit diagram illustrating the trigger signal generator circuit illustrated in FIG. 5. FIG. 11 is a timing chart illustrating the operation of the trigger signal generator circuit illustrated in FIG. 10.

Detector circuit 14 illustrated in FIG. 5 includes, for example, a level monitor circuit 41, a comparator circuit 42, an edge detector circuit 43, and a trigger signal generator circuit 44. Positive-phase component Voutp is input to an input terminal 14a of detector circuit 14, and negative-phase component Voutn is input to an input terminal 14b of detector circuit 14.

Level monitor circuit 41 is a circuit that monitors a level of differential signal Vout. Specifically, level monitor circuit 41 detects peak value Vpp and peak value Vpn. Level monitor circuit 41 generates threshold Vth based on peak value Vpp. Level monitor circuit 41 outputs peak value Vpn and threshold Vth to comparator circuit 42. Level monitor circuit 41 includes a single-phase peak-hold circuit 45 and a threshold generator circuit 46. Positive-phase component Voutp is input to threshold generator circuit 46 through input terminal 14a. Negative-phase component Voutn is input to single-phase peak-hold circuit 45 through input terminal 14b.

Single-phase peak-hold circuit 45 is a circuit that detects peak value Vpn of negative-phase component Voutn. Peak value Vpn corresponds to a bottom value (low-level) of the burst optical signal. Single-phase peak-hold circuit 45 outputs peak value Vpn to comparator circuit 42. As illustrated in FIG. 6, single-phase peak-hold circuit 45 includes a transistor 61, current sources 62 and 63, and a capacitor 64.

A base of transistor 61 is electrically connected to input terminal 14b. Negative-phase component Voutn is input to the base of transistor 61. A collector of transistor 61 is electrically connected to a supply voltage VCC. An emitter of transistor 61 is electrically connected to an output terminal 45a, and is electrically connected to the ground potential GND through a parallel circuit constituted by current source 62 and capacitor 64. Current source 63 is electrically connected between supply voltage VCC and output terminal 45a. Current source 62 generates a current Ih1 flowing in a direction for discharging electric charge stored in capacitor 64, and current source 63 generates a current Is1 flowing in a direction for storing electric charge in capacitor 64. Capacitor 64 has a capacitance Ch1.

Current source 62 releases (discharges) the electric charge stored in the capacitor 64 to the ground. A current value of current Is1 is set smaller than a current value of current Ih1. Current sources 62 and 63 bias transistor 61. That is, operation reference potential of transistor 61 is set by current sources 62 and 63. A discharging current flows in the direction for discharging capacitor 64 by a resultant current generated by current sources 62 and 63.

In single-phase peak-hold circuit 45, capacitor 64 is charged by negative-phase component Voutn. Specifically, when the peak voltage of negative-phase component Voutn becomes larger than a predetermined value, transistor 61 is turned to an on state, and electric charge is stored in capacitor 64. That is, when transistor 61 is turned to an on state, a charging current flows from the emitter of transistor 61 to capacitor 64 to charge capacitor 64. When the increase in the peak voltage of negative-phase component Voutn stops, the charging current flowing into capacitor 64 decreases as the voltage of capacitor 64 increases due to charging, and the discharging current obtained by subtracting current Is1 from current Ih1 and the charging current through transistor 61 are brought into equilibrium, which stabilizes the voltage of capacitor 64 at a fixed value. The voltage of capacitor 64 at this time corresponds to peak value Vpn of negative-phase component Voutn.

As the peak voltage of negative-phase component Voutn decreases, the charging current flowing into capacitor 64 further decreases, and discharging from capacitor 64 is started by current source 62. At this time, the impedances of current sources 62 and 63 are extremely high. Thus, the time constant (discharge time constant) of capacitor 64 during discharging is larger than the time constant (charge time constant) during charging. Thus, peak value Vpn is maintained substantially constant for a predetermined period. As the amplitude of negative-phase component Voutn increases, the peak value of negative-phase component Voutn increases. Since the signal input to single-phase peak-hold circuit 45 is negative-phase component Voutn of differential signal Vout, single-phase peak-hold circuit 45 performs an operation (detection) corresponding to half-wave rectification for differential signal Vout. Therefore, at the instant when a burst optical signal having a large amplitude ends, negative-phase component Voutn starts to decrease from the peak voltage, and peak value Vpn starts to decrease from a voltage in accordance with the peak voltage of the negative-phase component Voutn by discharging.

Threshold generator circuit 46 is a circuit that generates threshold Vth in accordance with peak value Vpp. Threshold generator circuit 46 detects peak value Vpp and outputs threshold Vth to comparator circuit 42. As illustrated in FIG. 7, threshold generator circuit 46 includes a transistor 65, current sources 66 and 67, a resistor element 68, and a capacitor 69.

A base of transistor 65 is electrically connected to input terminal 14a, and positive-phase component Voutp is input to the base of transistor 65. A collector of transistor 65 is electrically connected to power supply voltage VCC. An emitter of transistor 65 is electrically connected to output terminal 46a through resistor element 68, and is electrically connected to ground potential GND through a parallel circuit constituted by current source 66 and capacitor 69. Current source 67 is electrically connected between supply voltage VCC and output terminal 46a. Current source 66 generates a current Ih2 that flows in a direction for discharging electric charge stored in capacitor 69, and current source 67 generates a current Is2 that flows from a power supply wiring that supplies power supply voltage VCC to resistor element 68. Capacitor 69 has a capacitance Ch2. Thus, threshold generator circuit 46 has the same configuration as single-phase peak-hold circuit 45 except for resistor element 68.

In a manner similar to single-phase peak-hold circuit 45, threshold generator circuit 46 performs an operation for maintaining a peak voltage (peak value Vpp) on a single phase input signal (positive-phase component Voutp). In threshold generator circuit 46, peak value Vpp is detected as an emitter potential of transistor 65. When current Is2 flows through resistor element 68, a potential offset (shifted) toward a higher potential by a voltage Vs2 generated across resistor element 68 from the emitter potential is generated as threshold Vth. Although threshold generator circuit 46 detects the peak value in a manner similar to single-phase peak-hold circuit 45, the input signal is positive-phase component Voutp in threshold generator circuit 46. Thus, at the instant when a burst optical signal having a large amplitude ends, a peak voltage of positive-phase component Voutp decreases, and threshold Vth decreases from a voltage value in accordance with peak value Vpp at a higher speed than peak value Vpn.

In the present embodiment, transistor 61 of single-phase peak-hold circuit 45 and transistor 65 of threshold generator circuit 46 have the same electrical characteristics. For example, transistor 65 has the same transistor structure as transistor 61. For example, transistor 65 may have the same size as transistor 61. Current sources 62 and 66 are configured so that the current values of current Ih1 and current Ih2 become equal to each other. Current sources 63 and 67 are configured so that the current values of current Is1 and current Is2 become equal to each other. For example, current sources 62, 63, 66 and 67 may be constituted by transistors biased to a saturation region. Collector current densities of transistors 61 and 65 become equal to each other by the setting of the current values of currents Ih1, Ih2, Is1 and Is2. In order to achieve an equal filtering effect against noise, capacitors 64 and 69 may be configured so that capacitance Ch1 of capacitor 64 and capacitance Ch2 of capacitor 69 become equal to each other.

Further, capacitances Ch1 and Ch2 may be set so that erroneous detection does not occur when a burst optical signal including consecutive identical digits is input. For example, in a communication system in which a signal transmission speed is 10 Gb/s (bps; bits per second), capacitances Ch1 and Ch2 are set so that erroneous detection of the end of the burst optical signal does not occur by setting the consecutive identical digits to 72 bits. More specifically, in the communication system in which the transmission speed is 10 Gb/s, 100 psec is assigned to each of 1-bit signal. In this case, in capacitors 64 and 69, single-phase peak-hold circuit 45 and threshold generator circuit 46 may be configured so that discharging is performed at a discharge time constant having a value at least approximately twice a period (7.2 nsec in this embodiment) of a signal corresponding to the number of bits of the consecutive identical digits described above. For example, the discharge time constant when capacitors 64 and 69 are discharged may be set to 14.4 nsec or more.

On the other hand, when the discharge time constant is too large in detection of the end of a burst optical signal, the detection may be delayed. The discharge time constant in single-phase peak-hold circuit 45 is determined by a value obtained by dividing a value obtained by subtracting the current value of current Is1 from the current value of current Ih1 by capacitance Ch1, assuming that the impedances of current sources 62 and 63 are infinite. The discharge time constant in threshold generator circuit 46 is also determined in a manner similar to single-phase peak-hold circuit 45. More specifically, for example, under the assumption that the value obtained by subtracting the current value of current Is1 from the current value of current Ih1 is 10 µA, capacitance Ch1 is 10 pF, and the peak value is 100 mV, a voltage change of each of capacitors 64 and 69 at 14.4 nsec is 14.4 mV, which corresponds to a voltage drop of 14.4%. Therefore, by setting voltage Vs2 to 14.4 mV, it is possible to avoid erroneous detection of the end of a burst optical signal with respect to the CID, and to reliably detect a decrease in signal strength due to the end of the burst optical signal.

As will be described later, falling of a signal at the end of the burst optical signal is detected by comparing peak value Vpn with threshold Vth. Peak value Vpn and threshold Vth are voltages obtained by half-wave rectifying differential signal Vout. Thus, when a discharge time constant (peak hold discharge time constant) for holding a peak value is reduced to such an extent that erroneous detection (malfunction) due to the CID does not occur when the identical digit is continued, the threshold Vth decreases at a higher speed than the peak value Vpn. Accordingly, falling of the signal at the end of the burst optical signal is detected.

While the burst optical signal is input, the amplitude of negative-phase component Voutn and the amplitude of positive-phase component Voutp are substantially equal to each other. Thus, peak value Vpp and peak value Vpn are substantially equal to each other. The threshold Vth is obtained by adding voltage Vs2 to peak value Vpp. Thus, peak value Vpn is smaller than the threshold Vth while the burst optical signal is input.

On the other hand, when the burst optical signal ends, input current Iapd becomes a low-level state, only the remaining bypass current Iaoc1 is input to TIA core 11 as current signal Iin, and a state in which the amplitude of negative-phase component Voutn is larger than the amplitude of positive-phase component Voutp continues. At this time, since positive-phase component Voutp becomes a low-level state, the electric charge of capacitor 69 is released in threshold generator circuit 46, and peak value Vpp decreases. Peak value Vpn is maintained substantially constant in single-phase peak-hold circuit 45. Accordingly, peak value Vpn becomes larger than peak value Vpp. Thus, the end of the burst optical signal is detected by setting the value of voltage Vs2 so that peak value Vpn exceeds threshold Vth at the end of the burst optical signal. For example, the value of voltage Vs2 is set by previously measuring peak values Vpp and Vpn after the end of the burst optical signal.

Comparator circuit 42 is a circuit that detects the end of the burst optical signal by comparing peak value Vpn with threshold Vth. Comparator circuit 42 is, for example, a comparator circuit having a hysteresis characteristic. For example, a hysteresis width of comparator circuit 42 is set to a value that makes it possible to prevent erroneous detection caused by noise that is generated in level monitor circuit 41. Comparator circuit 42 compares peak value Vpn with threshold Vth, and outputs a signal LOS in either a high-level state or a low-level state to edge detector circuit 43 in accordance with a result of the comparison. Signal LOS indicates that the end of the burst optical signal is detected when it is at a high-level, and indicates that the input of the burst optical signal continues when it is at a low-level. Comparator circuit 42 sets signal LOS to a low-level when peak value Vpn is equal to or smaller than threshold Vth. Comparator circuit 42 sets signal LOS to a high-level when peak value Vpn is larger than threshold Vth.

Edge detector circuit 43 is a circuit that detects a change in a logical value in signal LOS. Specifically, edge detector circuit 43 detects a transition (rise) from a low-level to a high-level in signal LOS. The change of signal LOS from a low-level to a high-level is detected as a change from logical value 0 to logical value 1. Edge detector circuit 43 outputs a high-level signal FE for a predetermined period to trigger signal generator circuit 44 when detecting a rising edge. Edge detector circuit 43 outputs a low-level signal FE to trigger signal generator circuit 44 when the rising edge is not detected.

As illustrated in FIG. 8, edge detector circuits 43 includes a resistor element 71, a capacitor 72, an inverter circuit 73, and an AND circuit 74. Signal LOS is input to an input terminals 43a of edge detector circuit 43. Input terminal 43a is electrically connected to one end of resistor element 71 and one input terminal of AND circuit 74. The other end of resistor element 71 is electrically connected to the ground potential through capacitor 72, and is electrically connected to an input terminal of inverter circuit 73. An output terminal of inverter circuit 73 is electrically connected to the other input terminal of AND circuit 74. In edge detector circuits 43, resistor element 71 and capacitor 72 constitute a delay circuit.

FIG. 9 illustrates timing charts of signal LOS, a delay signal Va, an inverted signal Vb, and signal FE. In FIG. 9, a delay time from an input to an output by the switching of each of inverter circuit 73 and AND circuit 74 is sufficiently smaller than a time constant τd1 and is treated as negligible. As illustrated in FIG. 9, delay signal Va is input to the input terminal of inverter circuit 73. Delay signal Va is obtained by delaying signal LOS by a time constant τd1. Time constant τd1 is obtained by multiplying the resistance value of resistor element 71 by the capacitance of capacitor 72, for example. Inverter circuit 73 outputs inverted signal Vb from the output terminal of inverter circuit 73 in accordance with delay signal Va. Inverted signal Vb has a logical value opposite to the logical value of delay signal Va. More specifically, for example, inverter circuit 73 sets inverted signal Vb to a high-level when the voltage of delay signal Va is smaller than the threshold voltage of inverter circuit 73, and sets inverted signal Vb to a low-level when the voltage of delay signal Va is larger than the threshold voltage of inverter circuit 73. When signal LOS is switched from a low-level to a high-level, inverted signal Vb is switched from a high-level to a low-level with a delay of time constant τd1.

AND circuit 74 outputs a logical AND of signals input to two input terminals. That is, AND circuit 74 calculates the logical AND of signal LOS and inverted signal Vb, and outputs a result of the calculation as signal FE from an output terminal 43b. Signal FE becomes high-level only while inverted signal Vb is at a high-level when signal LOS as an input signal transitions from a low-level to a high-level, and becomes low-level when inverted signal Vb becomes low-level. In response to the detection of a rising edge of signal LOS, edge detector circuit 43 outputs a single-shot high-level pulse having a pulse width substantially equal to time constant τd1 as signal FE. The pulse width of signal FE is shorter than the pulse width of high-level signal LOS. The pulse width here corresponds to a period during which signals FE and LOS are maintained in a high-level state.

Trigger signal generator circuit 44 is a circuit that generates trigger signal TRIG. Trigger signal generator circuit 44 expands the pulse width of signal LOS to generate trigger signal TRIG. Trigger signal generator circuit 44 outputs trigger signal TRIG to feedback circuit 15. Trigger signal generator circuit 44 is also referred to as a one-shot timer circuit. As illustrated in FIG. 10, trigger signal generator circuit 44 includes, for example, an RS flip-flop circuit 75, a MOS transistor 76, a resistor element 77, and a capacitor 78. RS flip-flop circuit 75 includes two NOR circuits 75a and 75b.

An input terminal 44a of trigger signal generator circuit 44 is electrically connected to an S (set) terminal of RS flip-flop circuit 75. That is, signal FE is input to the S terminal of RS flip-flop circuit 75. The S terminal is electrically connected to one input terminal of NOR circuit 75b. A Q terminal of RS flip-flop circuit 75 which is an output terminal of NOR circuit 75a, is electrically connected to the other input terminal of NOR circuit 75b. A QB terminal of RS flip-flop circuit 75 which is an output terminal of NOR circuit 75b is electrically connected to one input terminal of NOR circuit 75a and to a gate terminal of MOS transistor 76.

MOS transistor 76 is, for example, an N-type (n-channel) MOS transistor. A source terminal of MOS transistor 76 is electrically connected to the ground potential. A drain terminal of MOS transistor 76 is electrically connected to a power supply wiring that supplies a power supply voltage VDD through resistor element 77 (pull-up resistor element), and is electrically connected to the ground potential through capacitor 78. The drain terminal of MOS transistor 76 is further electrically connected to an R (reset) terminal of RS flip-flop circuit 75. The R terminal is electrically connected to the other input terminal of NOR circuit 75a. The Q terminal (output terminal of NOR circuit 75a) is electrically connected to an output terminal 14c.

In this configuration, a logical value of a signal output from the QB terminal is inverted at the drain terminal of MOS transistor 76. More specifically, when a low-level signal is input to the gate terminal of MOS transistor 76, a delay signal Vd2 is generated by delaying the signal (high-level) having the logical value inverted at the drain terminal of MOS transistor 76 by a time constant τd2. Time constant τd2 is determined by the product of the resistance value of resistor element 77 and the capacitance of capacitor 78. Delay signal Vd2 is input to the other input terminal of NOR circuit 75a through the R terminal.

FIG. 11 illustrates timing charts of signal FE, the signal at the QB terminal, delay signal Vd2 and trigger signal TRIG. In FIG. 11, a delay time from an input to an output due to the switching of each of NOR circuits 75a and 75b and MOS transistor 76 is sufficiently smaller than time constant τd2 and is treated as negligible. As illustrated in FIG. 11, when a high-level signal FE is input to input terminal 44a, a high-level signal is input to the S terminal of RS flip-flop circuit 75, a signal (trigger signal TRIG) at the Q terminal (output terminal 14c) of RS flip-flop circuit 75 changes from a low-level to a high-level, and the signal at the QB terminal changes from a high-level to a low-level.

As a result, MOS transistor 76 changes from an on state to an off state, and delay signal Vd2 slowly rises from a low-level to a high-level at a speed defined by time constant τd2. When the voltage value of delay signal Vd2 exceeds a predetermined value, a reset (that is, a high-level delay signal Vd2) is input to the other input terminal (R terminal) of NOR circuit 75a. Accordingly, the signal (trigger signal TRIG) at the Q terminal changes from a high-level to a low-level, and the signal at the QB terminal returns to a high-level in an initial state. When the signal at the QB terminal becomes a high-level, MOS transistor 76 changes from an off-state to an on-state, and electric charge stored in capacitor 78 during an off-state is discharged by the drain current of MOS transistor 76. A discharge time at this time can be made sufficiently smaller than time constant τd2 by making an on-resistance of MOS transistor 76 smaller than the resistance value of resistor element 77.

In this manner, a reset operation is performed in accordance with time corresponding to the rising speed of the voltage value of delay signal Vd2 (reset signal). In order to reliably perform the reset operation after an elapse of a predetermined time from the rising edge of signal FE, it is desired that signal FE input to the S terminal returns to a low-level before a logical value of the reset signal becomes effective (before the reset signal is asserted). Thus, edge detector circuit 43 and trigger signal generator circuit 44 may be configured such that time constant τd2 is larger than the time constant τd1.

In detector circuit 14, when peak value Vpn exceeds threshold Vth, comparator circuit 42 outputs a high-level signal LOS to edge detector circuit 43. When edge detector circuit 43 detects that signal LOS have been switched from a low-level to a high-level, edge detector circuit 43 outputs a high-level single-shot pulse signal FE to trigger signal generator circuit 44. Trigger signal generator circuit 44 switches trigger signal TRIG from a low-level to a high-level in response to the rise of signal FE. The pulse width of trigger signal TRIG is expanded longer than the pulse width of signal FE. In this manner, when peak value Vpn exceeds threshold Vth, trigger signal TRIG output from detector circuit 14 is maintained at a high-level for a predetermined period. That is, a high-level single-shot pulse having a predetermined pulse width is output as trigger signal TRIG.

Figure 12:
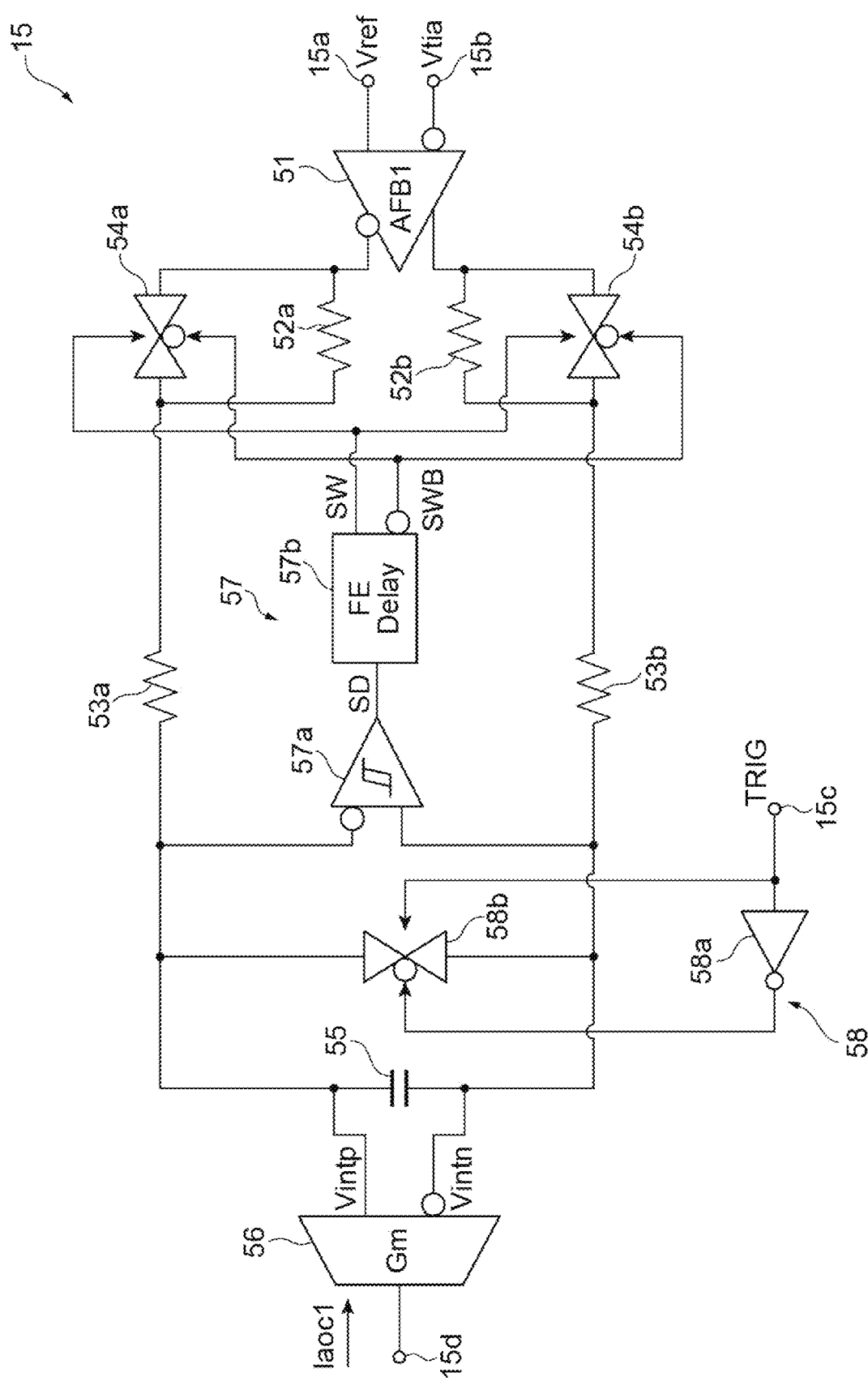
FIG. 12 is a block diagram illustrating a feedback circuit illustrated in FIG. 4.
Figure 13:
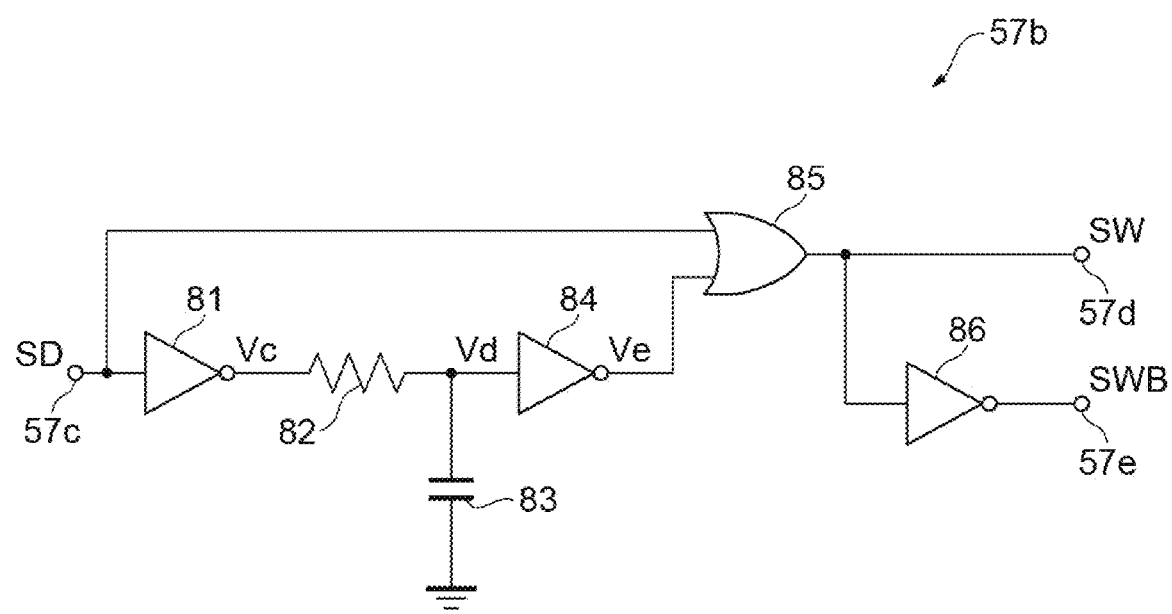
FIG. 13 is a circuit diagram illustrating a switch signal generator circuit illustrated in FIG. 12.
Figure 14:
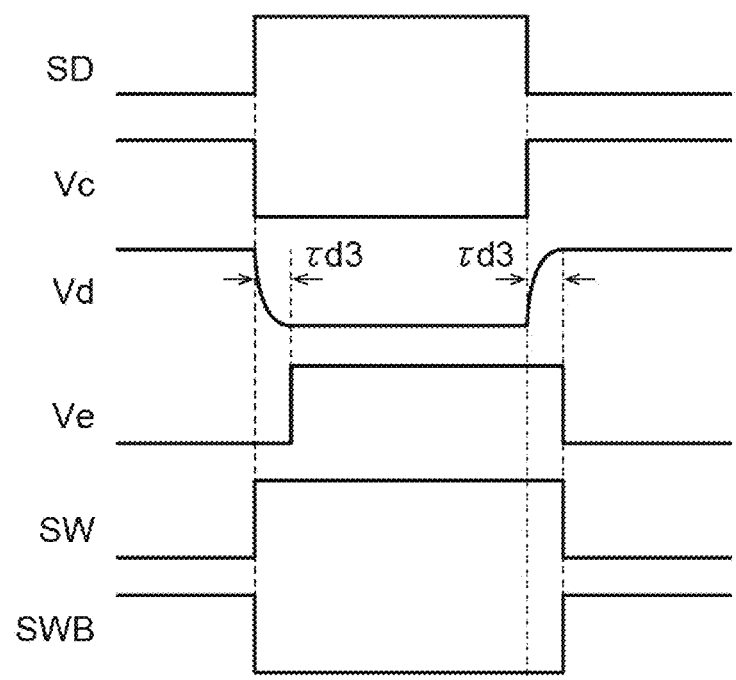
FIG. 14 is a timing chart illustrating the operation of the switch signal generator circuit illustrated in FIG. 13.

Next, details of feedback circuit 15 will be described with reference to FIGS. 12 to 14. FIG. 12 is a block diagram illustrating the feedback circuit illustrated in FIG. 4. FIG. 13 is a circuit diagram illustrating the switch signal generator circuit illustrated in FIG. 12. FIG. 14 is a timing chart illustrating the operation of the switch signal generator circuit illustrated in FIG. 13.

As illustrated in FIG. 12, feedback circuit 15 has an input terminal 15a, an input terminal 15b, an input terminal 15c, and an output terminal 15d. Input terminal 15a is electrically connected to the output terminal of reference voltage generator circuit 12. Reference voltage signal Vref is input to input terminal 15a. Input terminal 15b is electrically connected to the output terminal of TIA core 11. Voltage signal Vtia is input to input terminal 15b. Input terminal 15c is electrically connected to the output terminal 14c of detector circuit 14. Trigger signal TRIG is input to input terminal 15c. Output terminal 15d is electrically connected to input terminal 10a and the input terminal of TIA core 11. Bypass current Iaoc1 in accordance with a difference between a mean value (DC component) of voltage signal Vtia and reference voltage signal Vref is output from output terminal 15d.

Feedback circuit 15 includes a differential amplifier 51, resistor elements 52a, 52b, 53a, and 53b, switches 54a and 54b, capacitor 55, an operational transconductance amplifier (OTA) 56, a detector circuit 57 (second detector circuit), and a reset circuit 58. In the present embodiment, resistor element 52a and resistor element 52b have the same resistance value R1, and resistor element 53a and resistor element 53b have the same resistance value R2.

Differential amplifier 51 is a circuit that generates a differential signal by amplifying a differential input voltage Vin and outputs the generated differential signal. Differential input voltage Vin is a differential voltage (Vref-Vtia) obtained by subtracting voltage signal Vtia from reference voltage signal Vref. A positive-phase input terminal (non-inverting input terminal) of differential amplifier 51 is electrically connected to input terminal 15a, and reference voltage signal Vref is input to the positive-phase input terminal (non-inverting input terminal) of differential amplifier 51. A negative-phase input terminal (inverting input terminal) of differential amplifier 51 is electrically connected to input terminal 15b, and voltage signal Vtia is input to the negative-phase input terminal (inverting input terminal) of differential amplifier 51. A negative-phase output terminal of differential amplifier 51 is electrically connected to one end of resistor element 52a and one end of switch 54a. A positive-phase output terminal of differential amplifier 51 is electrically connected to one end of resistor element 52b and one end of switch 54b. The differential signal output from differential amplifier 51 includes a negative-phase component output from the negative-phase output terminal and a positive-phase component output from the positive-phase output terminal.

The other end of resistor element 52a and the other end of switch 54a are electrically connected to one end of resistor element 53a. That is, resistor element 52a and switch 54a are connected in parallel to each other, and constitute a parallel circuit. The other end of resistor element 52b and the other end of switch 54b are electrically connected to one end of resistor element 53b. That is, resistor element 52b and switch 54b are connected in parallel to each other, and constitute a parallel circuit. The other end of resistor element 53a is electrically connected to a positive-phase input terminal (non-inverting input terminal) of OTA 56, and is electrically connected to one end of capacitor 55. The other end of resistor element 53b is electrically connected to a negative-phase input terminal (inverting input terminal) of OTA 56, and is electrically connected to the other end of capacitor 55. In other words, capacitor 55 is inserted between differential inputs of OTA 56.

Resistor elements 53a and 53b and capacitor 55 reduce high-frequency components in a differential signal output from differential amplifier 51. Capacitor 55 holds an integral value of the differential input voltage (Vref−Vtia). Detector circuit 57 and reset circuit 58 are electrically connected to both ends of capacitor 55. Specifically, both ends of capacitor 55 are electrically connected to a negative-phase input terminal (inverting input terminal) and a positive-phase input terminal (non-inverting input terminal) of a comparator circuit 57a of detector circuit 57, respectively, and a switch 58b of reset circuit 58 is connected in parallel to capacitor 55.

Switches 54a and 54b are, for example, transfer gate switches. Switch signals SW and SWB (switching signals) are input from detector circuit 57 to switches 54a and 54b. Switch signals SW and SWB are signals including a high-level state and a low-level state. A logical value of switch signal SW and a logical value of switch signal SWB are opposite to each other.

Switches 54a and 54b are controlled by switch signal SW (switch signal SWB). More specifically, switches 54a and 54b are switched to an open state (off state) or a closed state (on state) in accordance with switch signals SW and SWB. In the present embodiment, when switch signal SW is at a high-level (switch signal SWB is at a low-level), switches 54a and 54b are set to a closed state. In a closed state, one terminal and the other terminal of switch 54a are in a conductive state. In a closed state, one terminal and the other terminal of switch 54b are in a conductive state. When switch signal SW is at a low-level (switch signal SWB is at a high-level), switches 54a and 54b are set to an open state. In an open state, one terminal and the other terminal of switch 54a are in an isolated state. In an open state, one terminal and the other terminal of switch 54b are in an isolated state. Details of switch signals SW and SWB will be described later.

OTA 56 is a circuit that converts a voltage signal into a current signal. OTA 56 has a known circuit configuration, for example, a configuration in which a current mirror circuit is added to an output portion of a differential amplifier circuit. OTA 56 has a transconductance Gm as a gain, and an input/output impedance of OTA 56 is infinite, for example. Bypass current Iaoc1 flows to a single output terminal (output terminal 15*d*) of OTA 56. Bypass current Iaoc1 flows into OTA 56 from output terminal 15*d*. As represented by Formula (1), when differential input voltage Vint is a positive value, bypass current Iaoc1 is obtained by multiplying differential input voltage Vint by transconductance Gm. Differential input voltage Vint is a differential voltage obtained by subtracting voltage Vintn input to a negative-phase input terminal (inverting input terminal) of OTA 56 from voltage Vintp input to a positive-phase input terminal (non-inverting input terminal) of OTA 56. When differential input voltage Vint is smaller than or equal to zero, bypass current Iaoc1 is zero (no flow). Bypass current Iaoc1 flows toward output terminal 15*d* of OTA 56 when bypass current Iaoc1 is a positive value.

[Formula 1]

$$Iaoc1 = Gm \times (Vintp - Vintn) = Gm \times Vint : Vint > 0$$

$$Iaoc1 = 0 : Vint \leq 0 \quad (1)$$

Since differential input voltage Vint varies in accordance with a charging voltage of capacitor 55 based on a difference between a mean value (DC component) of voltage signal Vtia and reference voltage signal Vref, bypass current Iaoc1 is generated in accordance with the charging voltage of capacitor 55. When differential input voltage Vint is a positive value, bypass current Iaoc1 flows from the outside of feedback circuit 15 toward OTA 56 (feedback circuit 15). In this case, bypass current Iaoc1 is subtracted from input current Iapd in transimpedance amplifier 10. A voltage value of reference voltage signal Vref may be set to the value of voltage signal Vtia when input current Iapd is a predetermined positive value. As a result, since the charging voltage of capacitor 55 does not become a positive value until input current Iapd becomes large to some extent, a state (open loop control) in which feedback control by feedback circuit 15 is not performed is set.

Detector circuit 57 detects the start of reception of the burst optical signal. Detector circuit 57 detects the start of reception of the burst optical signal when the charging voltage (differential input voltage Vint) of capacitor 55 becomes larger than a threshold (second threshold) for detecting the start of reception of the burst optical signal. When detector circuit 57 detects the start of the reception of the burst optical signal, detector circuit 57 outputs a high-level switch signal SW and a low-level switch signal SWB after a predetermined period. That is, detector circuit 57 sets switch signal SW to a high-level and sets switch signal SWB to a low-level. Detector circuit 57 includes a comparator circuit 57*a* and a switch signal generator circuit 57*b* (switching signal generator circuit).

Comparator circuit 57*a* is, for example, a comparator circuit having a hysteresis characteristic. For example, a hysteresis width of comparator circuit 57*a* is set to 3 dB in terms of an optical input level (optical signal strength). For example, when a transition from a low-level to a high-level is converted to an optical input level, the converted optical input level is set so as to be −3 dB from a receiving sensitivity level, and the converted optical input level for a transition from a high-level to a low-level is set so as to be −6 dB from the receiving sensitivity level. Comparator circuit 57*a* compares a potential (voltage Vintp) of one end of capacitor 55 with a potential (voltage Vintn) of the other end of capacitor 55 to output signal SD in either a high-level state or a low-level state to switch signal generator circuit 57*b* in accordance with a result of the comparison. That is, comparator circuit 57*a* sets signal SD to a high-level or a low-level in accordance with a result of the comparison.

One end of capacitor 55 is electrically connected to a negative-phase input terminal (inverting input terminal) of comparator circuit 57*a*, and the other end of capacitor 55 is electrically connected to a positive-phase input terminal (non-inverting input terminal) of comparator circuit 57*a*. Accordingly, comparator circuit 57*a* outputs a high-level signal SD when voltage Vintp is smaller than or equal to voltage Vintn, that is, when a charging voltage (differential input voltage Vint) of capacitor 55 is smaller than or equal to 0 V. Comparator circuit 57*a* outputs a low-level signal SD (detection signal) when voltage Vintp is larger than voltage Vintn, that is, when the charging voltage (differential input voltage Vint) of capacitor 55 is larger than 0 V. That is, comparator circuit 57*a* sets signal SD to a low-level when differential input voltage Vint is larger than 0 V, and sets signal SD to a high-level when differential input voltage Vint is smaller than or equal to 0 V. In other words, in the present embodiment, the threshold (second threshold) for detecting the start of reception of the burst optical signal is set to 0 V.

Switch signal generator circuit 57*b* is a circuit that generates switch signals SW and SWB. Switch signal generator circuit 57*b* generates switch signals SW and SWB based on signal SD. Although a logical value of switch signal SW is the same as a logical value of signal SD, a transition of the switch signals SW and SWB is delayed when signal SD transitions from a high-level to a low-level. That is, a delay time of the transition of switch signals SW and SWB in accordance with a transition of signal SD from a high-level to a low-level is larger than a delay time of a transition of switch signals SW and SWB in accordance with a transition of signal SD from a low-level to a high-level.

As illustrated in FIG. 13, switch signal generator circuit 57*b* includes an inverter circuit 81, a resistor element 82, a capacitor 83, an inverter circuit 84, an OR circuit 85, and an inverter circuit 86. Signal SD is input to an input terminal 57*c* of switch signal generator circuit 57*b*. Input terminal 57*c* is electrically connected to an input terminal of inverter circuit 81 and one input terminal of OR circuit 85. An output terminal of inverter circuit 81 is electrically connected to one end of resistor element 82. The other end of resistor element 82 is electrically connected to the ground potential through capacitor 83, and is electrically connected to an input terminal of inverter circuit 84. An output terminal of inverter circuit 84 is electrically connected to the other input terminal of OR circuit 85. An output terminal of OR circuit 85 is electrically connected to an output terminal 57*d* and is electrically connected to an input terminal of inverter circuit 86. An output terminal of inverter circuit 86 is electrically connected to an output terminal 57*e*. In switch signal generator circuit 57*b*, resistor element 82 and capacitor 83 constitute a delay circuit.

FIG. 14 illustrates timing charts of signal SD, an inverted signal Vc, a delay signal Vd, an inverted signal Ve, and switch signals SW and SWB. In FIG. 14, a delay time from an input to an output due to the switching of each of inverter circuits 81, 84, and 86 and OR circuit 85 is sufficiently smaller than a time constant τd3 and is treated as negligible. As illustrated in FIG. 14, inverted signal Vc having a logical value opposite to the logical value of signal SD is output from an output terminal of inverter circuit 81, and delay signal Vd delayed by a time constant τd3 with respect to inverted signal Vc is input to an input terminal of inverter circuit 84. Time constant τd3 is obtained by multiplying the resistance value of resistor element 82 by the capacitance of capacitor 83. Inverted signal Ve having a logical value opposite to a logical value of delay signal Vd is output from an output terminal of inverter circuit 84. OR circuit 85 calculates a logical OR of signal SD and inverted signal Ve, outputs a result of the calculation as switch signal SW from output terminal 57d, and also outputs switch signal SW to inverter circuit 86. Inverter circuit 86 outputs a signal having a logical value opposite to a logical value of switch signal SW from output terminal 57e as switch signal SWB.

When signal SD is switched from a low-level to a high-level, switch signal SW is switched from a low-level to a high-level without delay. In the present embodiment, as described above, a delay time from an input to an output due to the switching of OR circuit 85 is sufficiently smaller than time constant τd3 and is treated as negligible. On the other hand, when signal SD is switched from a high-level to a low-level, switch signal SW is switched from a high-level to a low-level with a delay of time constant τd3. That is, switch signal generator circuit 57b generates a low-level switch signal SW by delaying a low-level signal SD by a predetermined period when comparator circuit 57a determines that a charging voltage of capacitor 55 is larger than 0 V (threshold). That is, when the charging voltage of capacitor 55 changes from a negative value to a positive value, switch signal generator circuit 57b changes switch signal SW from a high-level to a low-level with a delay by time constant τd3 from the time of the change in the charging voltage.

Similarly, when signal SD is switched from a low-level to a high-level, switch signal SWB switches from a high-level to a low-level without delay. On the other hand, when signal SD is switched from a high-level to a low-level, switch signal SWB is switched from a low-level to a high-level with a delay of time constant τd3. That is, when the charging voltage of capacitor 55 changes from a negative value to a positive value, switch signal generator circuit 57b changes switch signal SWB from a low-level to a high-level with a delay of time constant τd3 from the time of the change in the charging voltage. The time constant τd3 is shorter than period Ts.

Feedback circuit 15 has a time constant and generates bypass current Iaoc1 at a response speed which is adjusted in accordance with a value of the time constant. The value of the time constant of feedback circuit 15 is determined by an open/closed state of switches 54a and 54b and constants of circuit elements. The value of the time constant of feedback circuit 15 is the time constant τ1 when switches 54a and 54b are in an open state, and is time constant τ2 when switches 54a and 54b are in a closed state. When switch signal SW is at a low-level and, at the same time, switch signal SWB is at a high-level, switches 54a and 54b are in an open state, and thus time constant τ1 is determined by resistance value R1 of resistor elements 52a and 52b, resistance value R2 of resistor elements 53a and 53b, and a capacitance C1 of capacitor 55, as represented by Formula (2).

On the other hand, when switch signal SW is at a high-level, switches 54a and 54b are in a closed state. Therefore, a resistance value of a parallel circuit constituted by switches 54a and 54b, and resistor elements 52a and 52b is substantially equal to zero. In the present embodiment, it is considered that resistance values of switches 54a and 54b in a closed state are sufficiently smaller than resistance values R1 of resistor elements 52a and 52b, and thus the resistance values of switches 54a and 54b can be ignored. Therefore, time constant τ2 is determined by resistance value R2 and capacitance C1 as represented by Formula (3).

In other words, switch signals SW and SWB are signals for switching the time constant between time constant τ1 and time constant τ2.

[Formula 2]

$$\tau 1 = 2 \times (R1 + R2) \times C1 \quad (2)$$

[Formula 3]

$$\tau 2 = 2 \times R2 \times C1 \quad (3)$$

As represented by Formulae (2) and (3), time constant τ2 is smaller than time constant τ1. That is, when the time constant of feedback circuit 15 is set to time constant τ2, a response speed of control of bypass current Iaoc1 by feedback circuit 15 is higher than a response speed when the time constant of feedback circuit 15 is set to time constant τ1. In other words, when switch signal SW is at a high-level (switch signal SW is maintained in a high-level state), a slew rate of bypass current Iaoc1 adjusted by feedback circuit 15 is larger than that when switch signal SW is at a low-level (switch signal SW is maintained in a low-level state). The change in the time constant of feedback circuit 15 causes no change in a DC gain of an open loop transfer function in a control loop of feedback circuit 15, and a value of bypass current Iaoc1 does not become discontinuous by a switch of the time constant.

Reset circuit 58 is a circuit that releases electric charge of capacitor 55. In other words, reset circuit 58 performs a reset operation for returning a state of feedback circuit 15 to an initial state by setting differential input voltage Vint to 0 V by trigger signal TRIG. Reset circuit 58 includes an inverter circuit 58a and switch 58b. Trigger signal TRIG is input to reset circuit 58 from detector circuit 14 through input terminal 15c. Inverter circuit 58a generates an inverted signal having a logical value opposite to a logical value of trigger signal TRIG and outputs the generated inverted signal to switch 58b.

Switch 58b is, for example, a transfer gate switch. Trigger signal TRIG and the inverted signal having a logical value opposite to a logical value of trigger signal TRIG are input to switch 58b. For example, when trigger signal TRIG is at a high-level, the inverted signal is at a low-level, and when trigger signal TRIG is at a low-level, the inverted signal is at a high-level. Switch 58b is controlled by trigger signal TRIG. Switch 58b is set to an open state or a closed state in accordance with trigger signal TRIG and the inverted signal thereof. In the present embodiment, when trigger signal TRIG is at a high-level, switch 58b is set to a closed state. When trigger signal TRIG is at a low-level, switch 58b is set to an open state.

When switch 58b is in a closed state, a closed circuit is formed by capacitor 55 and switch 58b, and electric charge of capacitor 55 is released. That is, the charging voltage (differential input voltage Vint) of capacitor 55 becomes 0 V and is reset. When switch 58b is in an open state, a direct current resistance across capacitor 55 is infinite, so that capacitor 55 is brought into a chargeable state. When capacitor 55 returns to a chargeable state, the time constant of feedback circuit 15 is set to time constant τ2. Capacitor 55 is charged and discharged by a differential signal output from differential amplifier 51.

Figure 15:
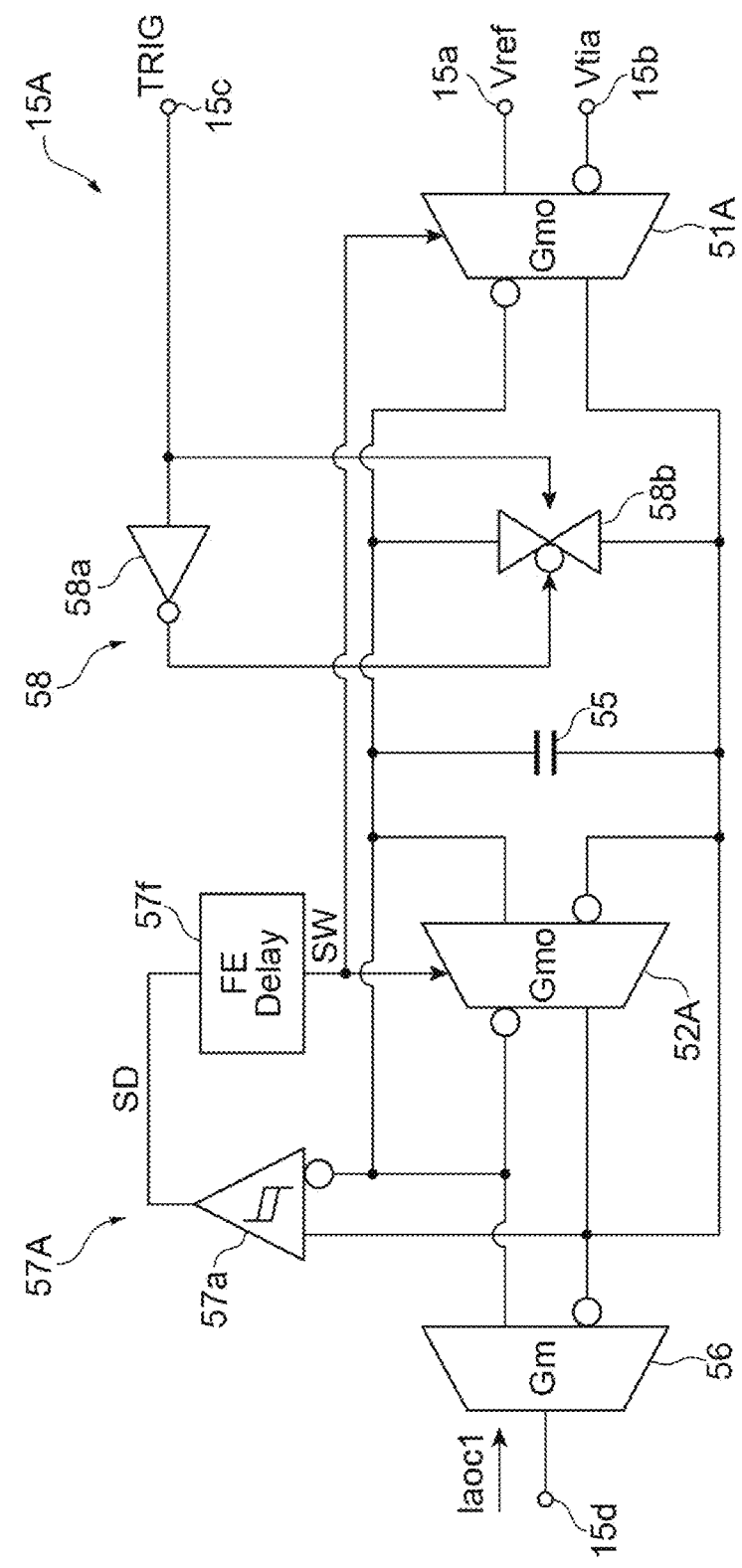
FIG. 15 is another block diagram illustrating the feedback circuit illustrated in FIG. 4.

FIG. 15 is another block diagram of the feedback circuit illustrated in FIG. 4. As illustrated in FIG. 15, a feedback circuit 15A is mainly different from feedback circuit 15 in that feedback circuit 15A includes an OTA 51A instead of differential amplifier 51, that feedback circuit 15A includes an OTA 52A instead of resistor elements 52a, 52b, 53a and 53b, and switches 54a and 54b, and that feedback circuit 15A includes a detector circuit 57A (second detector circuit) instead of detector circuit 57.

OTA 51A has a transconductance Gmo, and an input/output impedance of OTA 51A is infinite, for example. The input impedance of OTA 51A may be, for example, ten times or more output impedances of TIA core 11 and reference voltage generator circuit 12. A positive-phase input terminal (non-inverting input terminal) of OTA 51A is electrically connected to input terminal 15a, and reference voltage signal Vref is input to the positive-phase input terminal (non-inverting input terminal) of OTA 51A through input terminal 15a. A negative-phase input terminal (inverting input terminal) of OTA 51A is electrically connected to input terminal 15b, and voltage signal Vtia is input to the negative-phase input terminal (inverting input terminal) of OTA 51A through input terminal 15b.

As represented by Formulae (4) and (5), a differential output current obtained by multiplying differential input voltage Vin by a half value of transconductance Gmo flows through a differential output terminal of OTA 51A. Differential input voltage Vin corresponds to a voltage difference between the positive-phase input terminal (non-inverting input terminal) and the negative-phase input terminal (inverting input terminal). For example, differential input voltage Vin is expressed as Vin=Vref−Vtia. When differential input voltage Vin is positive, a current Ioutp flows from a positive-phase output terminal (non-inverting output terminal) of OTA 51A to the outside, and a current Ioutn flows from the outside to a negative-phase output terminal (inverting output terminal) of OTA 51A. On the other hand, when differential input voltage Vin is negative, current Ioutp flows from the outside to the positive-phase output terminal of OTA 51A, and current Ioutn flows from the negative-phase output terminal of OTA 51A to the outside. A differential output current corresponds to a difference Ioutp−Ioutn between current Ioutp and current Ioutn. The positive-phase input terminal (non-inverting input terminal) and the negative-phase input terminal (inverting input terminal) constitute a differential output terminal. In Formulae (4) and (5), the sign of a current is defined to be positive in a direction flowing out from OTA 51A to the outside, and to be negative in a direction flowing into OTA 51A from the outside.

[Formula 4]

$$Ioutp = \frac{Gmo}{2} \times (Vref - Vtia) = \frac{Gmo}{2} \times Vin \quad (4)$$

[Formula 5]

$$Ioutn = -\frac{Gmo}{2} \times (Vref - Vtia) = -\frac{Gmo}{2} \times Vin \quad (5)$$

The negative-phase output terminal (inverting output terminal) of OTA 51A is electrically connected to one end of capacitor 55, a positive-phase input terminal (non-inverting input terminal) of an OTA 52A, a negative-phase output terminal (inverting output terminal) of OTA 52A, and a positive-phase input terminal (non-inverting input terminal) of an OTA 56. A positive-phase output terminal (non-inverting output terminal) of OTA 51A is electrically connected to the other end of capacitor 55, a negative-phase input terminal (inverting input terminal) of OTA 52A, a positive-phase output terminal (non-inverting output terminal) of OTA 52A, and a negative-phase input terminal (inverting input terminal) of OTA 56. Similarly to feedback circuit 15, in feedback circuit 15A, a detector circuit 57A and a reset circuit 58 are electrically connected to both ends of capacitor 55. Specifically, the both ends of capacitor 55 are electrically connected to a negative-phase input terminal (inverting input terminal) and a positive-phase input terminal (non-inverting input terminal) of a comparator circuit 57a of detector circuit 57A, respectively, and switch 58b of reset circuit 58 is connected in parallel to capacitor 55.

OTA 52A has a transconductance Gmo as with OTA 51A. As described above, the positive-phase input terminal (non-inverting input terminal) of OTA 52A is electrically connected to the negative-phase output terminal (inverting output terminal) of OTA 52A, and the negative-phase input terminal (inverting input terminal) of OTA 52A is electrically connected to the positive-phase output terminal (non-inverting output terminal) of OTA 52A. That is, the output terminal of OTA 52A is connected to the input terminal of OTA 52A so as to perform a negative feedback. Accordingly, OTA 52A functions as a resistor equivalently having a resistance value of 1/Gmo.

Therefore, a transfer function of feedback circuit 15A is determined by transconductances Gm and Gmo and capacitance C1 as represented by Formula (6). Capacitance C1 is a capacitance of capacitor 55.

[Formula 6]

$$\frac{Iaoc1(s)}{Vin(s)} = \frac{Gm}{1 + s \times \frac{2 \times C1}{Gmo}} \quad (6)$$

Detector circuit 57A is mainly different from detector circuit 57 in that detector circuit 57A includes a switch signal generator circuit 57f (switching signal generator circuit) instead of switch signal generator circuit 57b. Switch signal generator circuit 57f is mainly different from switch signal generator circuit 57b in that switch signal generator circuit 57f does not include inverter circuit 86. Switch signal generator circuit 57f outputs switch signal SW to OTAs 51A and 52A.

Values of transconductances Gmo of OTAs 51A and 52A vary in accordance with a logical value of switch signal SW. In the present embodiment, the values of transconductances Gmo of OTAs 51A and 52A in accordance with a logical value of switch signal SW are set so as to be identical to each other. For example, when switch signal SW is at a low-level, the value of transconductance Gmo is set to a transconductance gm1. When switch signal SW is at a high-level, the value of transconductance Gmo is set to a transconductance A×gm1. The constant A is a real number larger than 1. As described above, under the condition that the values of transconductances Gmo in accordance with the logical value of switch signal SW are the same in OTAs 51A and 52A, a DC transfer function of feedback circuit 15A is represented by Formula (6) even when transconductances Gmo change.

When switch signal SW is at a low-level, the value of the time constant of feedback circuit 15A is time constant τ1. When switch signal SW is at a high-level, the value of the time constant of feedback circuit 15A is time constant τ2. When switch signal SW is at a low-level, the value of transconductance Gmo is transconductance gm1. Therefore, OTA 52A functions as a resistor equivalently having a resistance value of 1/gm1. Accordingly, time constant τ1 is determined by the resistance value 1/gm1 of OTA 52A and capacitance C1 of capacitor 55 as represented by Formula (7).

[Formula 7]

$$\tau 1 = 2 \times \frac{C1}{gm1} \quad (7)$$

On the other hand, when switch signal SW is at a high-level, the value of transconductance Gmo is transconductance A×gm1. Therefore, OTA 52A functions as a resistor equivalently having a resistance value of 1/(A×gm1). Accordingly, time constant τ2 is determined by the resistance value 1/(A×gm1) of OTA 52A and capacitance C1 of capacitor 55 as represented by Formula (8).

[Formula 8]

$$\tau 2 = 2 \times \frac{C1}{A \times gm1} \quad (8)$$

In this manner, the time constant of feedback circuit 15A when switch signal SW is at a high-level is 1/A times larger than that when switch signal SW is at a low-level, feedback circuit 15A can perform feedback control at a high speed.

Figure 16:
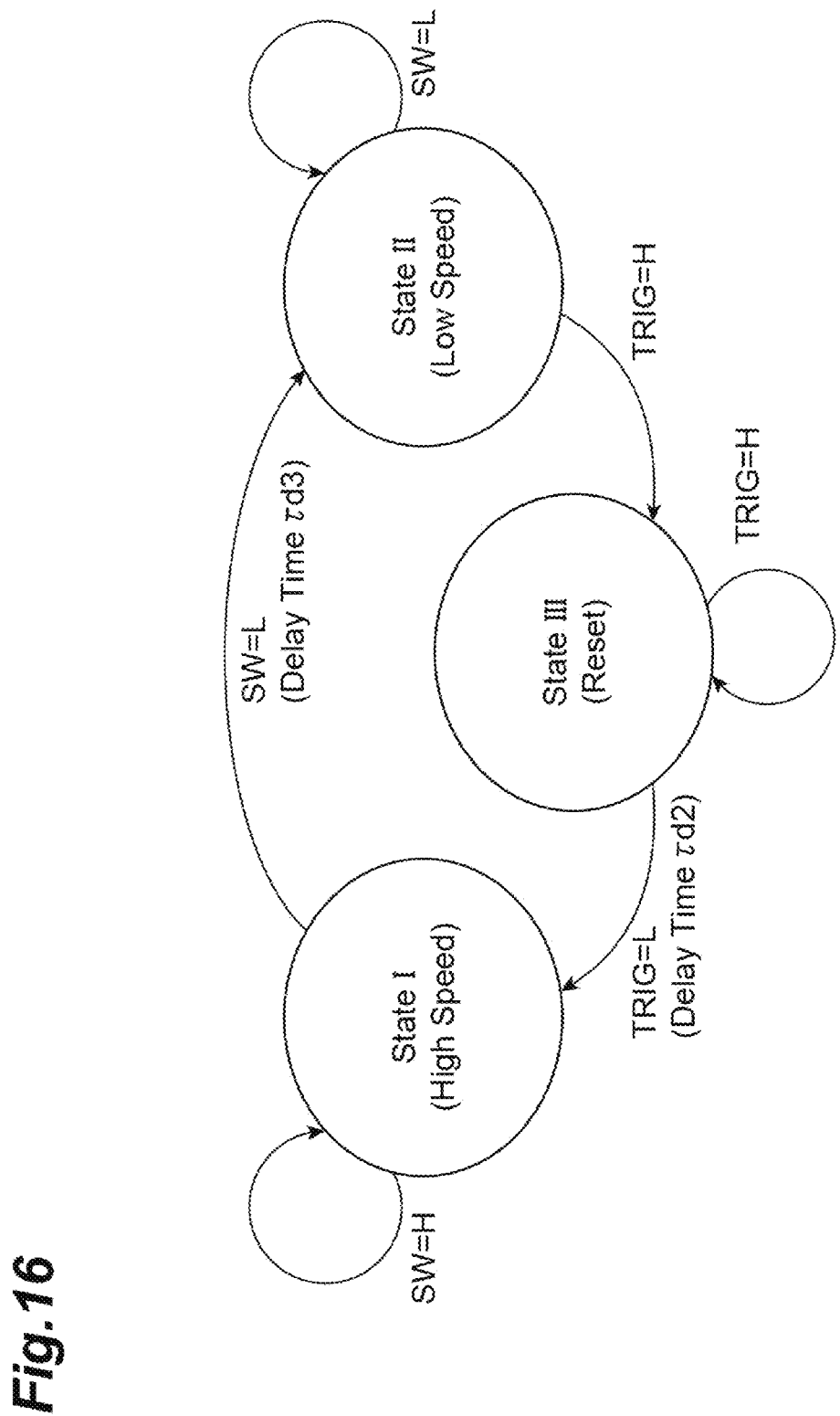
FIG. 16 is a state transition diagram illustrating a state transition of time constant control by the feedback circuit.

Next, a state transition of feedback control by feedback circuits 15 and 15A will be described with reference to FIG. 16. FIG. 16 is a state transition diagram illustrating the state transition of feedback control by the feedback circuit. The state of feedback control by feedback circuits 15 and 15A includes a state I in which feedback control is performed at high speed, a state II in which the feedback control is performed at a low speed, and a state III in which the charging voltage of capacitor 55 is reset. Since a time constant can be regarded as a delay time, each of time constants τd2 and τd3 is expressed as a delay time in FIG. 16.

In the following description, for convenience of description, the feedback control by feedback circuits 15 and 15A is merely referred to as the "feedback control". In the present embodiment, the "feedback control" means that bypass current Iaoc1 is changed in accordance with differential input voltage Vin. For example, when feedback circuits 15 and 15A perform feedback control at a high speed, feedback circuits 15 and 15A change bypass current Iaoc1 in a relatively short response time in accordance with a change in differential input voltage Vin. Further, for example, when feedback circuits 15 and 15A perform feedback control at a low speed, feedback circuits 15 and 15A change bypass current Iaoc1 in a relatively long response time in accordance with a change in differential input voltage Vin. In state I, the time constants of feedback circuits 15 and 15A are set to time constant τ2, respectively. In state II, the time constants of feedback circuits 15 and 15A are set to time constant τ1, respectively. In state III, the charging voltage of capacitor 55 is reset. In the following description, since switch signal SWB has a logical value opposite to the logical value of switch signal SW, the description of switch signal SWB will be omitted.

In an initial state in which transimpedance amplifier 10 starts operating in response to the start of reception of the burst optical signal, the feedback control is in state I. When no burst optical signal is input, the difference between reference voltage signal Vref and voltage signal Vtia is zero, so that capacitor 55 is not charged, and bypass current Iaoc1 is zero (does not flow). Therefore, since switch signal SW is maintained at a high-level, the feedback control is maintained in state I. When switch signal SW is at a high-level, the time constants of feedback circuits 15 and 15A are set to time constant τ2, respectively, the feedback control is performed at a high speed.

When receiver 9 receives the burst optical signal, photodiode PD generates input current Iapd, and input current Iapd is input to transimpedance amplifier 10. Input current Iapd (current signal Iin) generated in accordance with the burst optical signal includes a DC component. Therefore, since a mean value of input current Iapd increases after the start of reception of the burst optical signal, voltage signal Vtia decreases, and a mean value (DC component) of voltage signal Vtia becomes smaller than reference voltage signal Vref. Then, in feedback circuits 15 and 15A, differential input voltage Vin (Vref−Vtia) is amplified, the charging voltage (differential input voltage Vint) of capacitor 55 becomes a positive value, and bypass current Iaoc1 starts to flow. In response to the charging voltage (differential input voltage Vint) of capacitor 55 becoming a positive value, signal SD output from comparator circuit 57a is switched from a high-level to a low-level.

A voltage value of reference voltage signal Vref may be set to the value of voltage signal Vtia when input current Iapd is a predetermined positive value. As a result, the charging voltage of capacitor 55 does not become a positive value until receiver 9 receives a burst optical signal having such a signal strength that input current Iapd increases to some extent, and thus state I is maintained.

Then, when signal SD is switched from a high-level to a low-level, switch signals SW output from switch signal generator circuits 57b and 57f are switched from a high-level to a low-level with a delay of time constant τd3. That is, the feedback control remains in state I until time constant τd3 elapses after the start of reception of the burst optical signal is detected. During this period, since the preamble signal of the burst optical signal is input, feedback circuits 15 and 15A perform feedback control at a high speed so that differential input voltage Vin generated by the input of the burst optical signal becomes small (that is, so that a DC component included in input current Iapd is removed).

When switch signal SW is switched from a high-level to a low-level, the state of the feedback control changes to state II. At this time, the time constants of feedback circuits 15 and 15A are switched from time constant τ2 to time constant τ1, respectively, and the feedback control is performed at a low speed. While the payload signal of the burst optical signal is input, the charging voltage (differential input voltage Vint) of capacitor 55 maintains a positive value. Therefore, since switch signal SW is maintained at a low-level, the feedback control is maintained in state II. That is, in the period of the payload signal, the time constants of feedback circuits 15 and 15A are maintained at time constant τ1, respectively. In state II, differential signal Vout is normally output from output terminals 10b and 10c of transimpedance amplifier 10.

When the burst optical signal ends, the current value of input current Iapd rapidly decreases to zero. When a burst optical signal with a weak strength is input without an interval after the burst optical signal ends, the current value of input current Iapd rapidly decreases in the same way. In either case, voltage signal Vtia becomes larger than reference voltage signal Vref, and a residual DC offset, which is a potential difference between the DC component of voltage signal Vtia and the DC component of reference voltage signal Vref, becomes large. When receiver 9 finishes receiving the burst optical signal, voltage signal Vtia becomes larger than reference voltage signal Vref, so that the voltage value of negative-phase component Voutn becomes large and the voltage value of positive-phase component Voutp becomes small. Accordingly, in detector circuit 14, peak value Vpn changes at a relatively high speed in a charging direction, and threshold Vth changes at a relatively low speed in a discharging direction. Then, when detector circuit 14 detects that peak value Vpn becomes larger than threshold Vth, trigger signal TRIG is switched from a low-level to a high-level, and the state of the feedback control changes to state III.

When the state of the feedback control changes to state III, a high-level trigger signal TRIG is supplied to feedback circuits 15 and 15A, electric charge stored in capacitor 55 is released, and feedback circuits 15 and 15A are reset to an initial state. Accordingly, since the charging voltage (differential input voltage Vint) of capacitor 55 becomes 0 V, signal SD output from comparator circuit 57a is switched from a low-level to a high-level. When signal SD is switched from a low-level to a high-level, switch signal SW is switched from a low-level to a high-level without delay. In the present embodiment, since delay times due to switching of inverter circuits 81, 84, and 86 and OR circuit 85 are considered to be sufficiently smaller than time constants τ1 and τ2 and can be ignored as described above, the switching of switch signal SD is performed without delay. As a result, the time constants of feedback circuits 15 and 15A are switched from time constant τ1 to time constant τ2, respectively. Since trigger signal TRIG is maintained at a high-level for a period of time constant τd2 set by trigger signal generator circuit 44, the state of the feedback control remains in state III during this period. Time constant τd2 is set to a value necessary for reliably resetting capacitor 55.

Then, trigger signal generator circuit 44 switches trigger signal TRIG from a high-level to a low-level when the period of time constant τd2 elapses from a rise time of signal FE, and the state of the feedback control changes to state I. In state I, the time constants of feedback circuits 15 and 15A are set to time constant τ2, and thus the feedback control is performed at a high speed.

Figure 17:
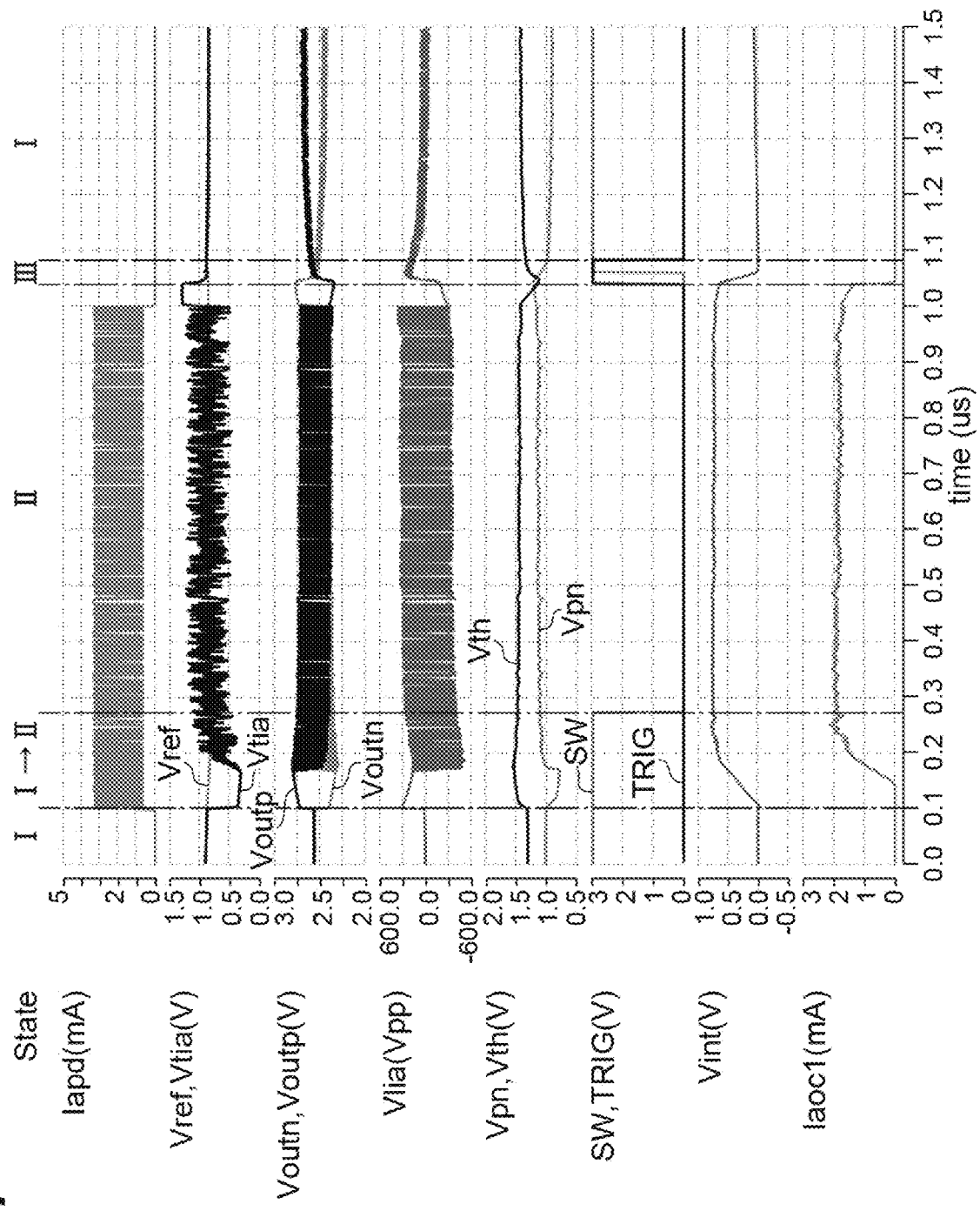
FIG. 17 is a diagram illustrating a simulation result.

Next, effects of transimpedance amplifier 10 will be described with reference to FIG. 17. FIG. 17 is a diagram illustrating a simulation result of the circuit operation of transimpedance amplifier 10. FIG. 17 illustrates changes over time in each current value and each voltage value of transimpedance amplifier 10, and the state of feedback control by feedback circuit 15A.

The simulation result illustrated in FIG. 17 is a calculation result when a cut-off frequency faoc2 of feedback circuit 16 is set to 16 kHz, a cutoff frequency fac of the AC coupling between transimpedance amplifier 10 and limiting amplifier 20 is set to 1.6 MHz, a value obtained by subtracting the current value of current Is1 from the current value of current Ih1 is set to 20 μA, and a value obtained by subtracting the current value of current Is2 from the current value of current Ih2 is set to 20 μA. Further, in the calculation, capacitances Ch1 and Ch2 are set to 1 pF, voltage Vs2 is set to 50 mV, and resistance values of resistor elements 71, 77, 82, 52a, 52b, 53a, and 53b, capacitances of capacitors 72, 78, 83, and 55, and transconductances of OTA 51A and 52A are set so that time constant τd1 is 50 nsec, time constant τd2 is 40 nsec, time constant τd3 is 150 nsec, time constant τ1 is 250 nsec, and time constant τ2 is 75 nsec.

FIG. 17 illustrates state transitions of feedback control by feedback circuit 15A, and timing charts of input current Iapd, reference voltage signal Vref and voltage signal Vtia, negative-phase component Voutn and positive-phase component Voutp, differential signal Vlia input to limiting amplifier 20, peak value Vpn and threshold Vth, switch signal SW and trigger signal TRIG, differential input voltage Vint, and bypass current Iaoc1. The horizontal axis of FIG. 17 represents time t.

In this simulation, a first burst optical signal having a relatively strong signal strength is input to receiver 9 when time t is 0.1 μsec, and the first burst optical signal ends when time t is 1.0 μsec. In the present embodiment, a delay time when photodiode PD converts an optical signal to a current signal is sufficiently small and is treated as negligible. A mean value of input current Iapd by the first burst optical signal is 2 mA. Subsequently, when time t is 1.0 μsec, a second burst optical signal having a relatively weak signal strength is input to receiver 9. A mean value of input current Iapd by the second burst optical signal is 125 μA. This is the worst condition in which a burst optical signal having a relatively weak signal strength is affected by a burst optical signal having a relatively strong signal strength which has been input immediately before the burst optical signal having a relatively weak signal strength. The circuit operation will be described below using feedback circuit 15A, but, the same applies to feedback circuit 15 or any other feedback circuits having equivalent functions.

In an initial state before the input of the burst optical signal (when time t is less than 0.1 pec), the feedback control is in state I. As described above, in a section of state I, since the burst optical signal is not input to receiver 9, bypass current Iaoc1 is 0 mA, and feedback circuit 15A performs an open loop control (high-speed control). In the present embodiment, the open loop control means a state in which control for generating bypass current Iaoc1 in accordance with differential input voltage Vin is not performed. Since the difference between reference voltage signal Vref and voltage signal Vtia is 0 V, capacitor 55 is not charged, the charging voltage (differential input voltage Vint) of capacitor 55 is 0 V, and bypass current Iaoc1 does not flow. Since differential input voltage Vint is 0 V, signal SD output from comparator circuit 57a is maintained at a high-level, and switch signal SW is maintained at a high-level.

Therefore, while the burst optical signal is not input to receiver 9, the time constant of feedback circuit 15A is set to time constant τ2, so that the feedback control is performed at a high speed. Positive-phase component Voutp and negative-phase component Voutn have the same potential, and the amplitude of differential signal Vlia is 0 Vpp. At this time, in detector circuit 14, peak value Vpn is smaller than threshold Vth, and thus trigger signal TRIG is maintained at a low-level.

When the first burst optical signal is input to receiver 9 at the time t of 0.1 μsec, input current Iapd is input to TIA core 11 as current signal Iin, voltage signal Vtia decreases, and differential input voltage Vin of detector circuit 14 increases. As a result, electric charge is stored in capacitor 55 and differential input voltage Vint increases. In the initial state, since feedback circuit 15A performs an open loop control, differential input voltage Vint is 0 V. However, when differential input voltage Vint becomes a positive value and exceeds the hysteresis width of comparator circuit 57a, signal SD is switched from a high-level to a low-level by comparator circuit 57a. Then, switch signal SW is maintained at a high-level until time constant τd3 elapses after signal SD has been switched from a high-level to a low-level (section of State I→II in FIG. 17).

At this time, since differential input voltage Vin becomes large, positive-phase component Voutp becomes larger than negative-phase component Voutn, and differential amplifiers 13a and 13b perform a limit operation. As a result, a modulation signal (AC signal) temporarily disappears and becomes a no-signal state, but bypass current Iaoc1 increases, following an increase in the charging voltage (differential input voltage Vint) of capacitor 55 by a closed-loop control at a high-speed. A delay occurs until bypass current Iaoc1 changes in accordance with differential input voltage Vint. When time t is around 0.25 µsec, bypass current Iaoc1 converges to a substantially constant value. As bypass current Iaoc1 increases, current signal Iin decreases, and voltage signal Vtia starts to increase, so that the modulation signal recovers from time t of about 0.2 µsec and a settling (signal stabilization) of transimpedance amplifier 10 is completed before switch signal SW is switched to a low-level (before time constant τd3 elapses).

In response to this, differential signal Vlia changes with a large amplitude centered around 0 V, and is in a state (settling completed state) in which differential signal Vlia can be normally received by limiting amplifier 20. In detector circuit 14, peak value Vpn decreases, following negative-phase component Voutn in the section of a non-signal state, but increases with a recovery of the modulation signal. On the other hand, threshold Vth temporarily increases, following positive-phase component Voutp in the section of the non-signal state of positive-phase component Voutp, but decreases with the recovery of the modulation signal. In the section of State I→II, since peak value Vpn is smaller than threshold Vth, trigger signal TRIG is maintained at 0 V (low-level). Therefore, when the start of reception of the burst optical signal is detected, the charging voltage (differential input voltage Vint) of capacitor 55 is not reset, and capacitor 55 is maintained in a chargeable state. As described above, settling of transimpedance amplifier 10 is reliably performed in about 0.2 µsec after the burst optical signal has been input.

Subsequently, when time constant τd3 elapses after signal SD has changed from a high-level to a low-level, switch signal SW changes from a high-level to a low-level, and the state of the feedback control changes from state I to state II. In the section of state II, each signal of transimpedance amplifier 10 is in a stable state and maintains a constant state.

Then, when time t is 1.0 µsec, the reception of the first burst optical signal ends, and subsequently, the reception of the second burst optical signal starts without an interval. When the first burst optical signal ends, input current Iapd immediately decreases, so that voltage signal Vtia increases due to the decrease of current signal Iin, and differential input voltage Vin immediately changes to a negative side. Then, differential amplifiers 13a and 13b perform the limit operation, and the modulation signal temporarily disappears to enter a no-signal state. In response to this, positive-phase component Voutp decreases immediately and then decreases slowly. On the other hand, negative-phase component Voutn immediately increases and then gradually increases. The gradual decrease of positive-phase component Voutp and the gradual increase of negative-phase component Voutn are caused by the difference between a high-frequency gain and a low-frequency gain of differential amplifier 13b due to AC coupling in accordance with the end of the first burst optical signal.

In response to the gradual decrease of positive-phase component Voutp and the gradual increase of negative-phase component Voutn, differential signal Vlia gradually increases from a low-level of the first burst optical signal with the time constant (corresponding to cutoff frequency fac=1.6 MHz) by AC coupling. Peak value Vpn increases at a charge time constant, following negative-phase component Voutn, while threshold Vth decreases at a discharge time constant, following positive-phase component Voutp. As a result, the difference between threshold Vth and peak value Vpn disappears immediately, and peak value Vpn exceeds threshold Vth when time t is around 1.03 µsec.

When peak value Vpn exceeds threshold Vth, comparator circuit 42 of detector circuit 14 switches signal LOS from a low-level to a high-level, and edge detector circuit 43 detects the rise of signal LOS and outputs a high-level single-shot pulse signal FE to trigger signal generator circuit 44. Then, trigger signal generator circuit 44 generates trigger signal TRIG by extending the pulse width of the high-level single pulse signal FE to the time of time constant τd2. As a result, the state of feedback control changes from state II to state III.

In the section of state III, since trigger signal TRIG is maintained at a high-level, switch 58b is set to a closed state, and electric charge of capacitor 55 is released. As a result, feedback circuit 15A is reset. Since a voltage (differential input voltage Vint) across capacitor 55 immediately becomes 0 V, bypass current Iaoc1 also immediately becomes 0 mA. Accordingly, differential input voltage Vin returns to 0 V, and the potential of positive-phase component Voutp and the potential of negative-phase component Voutn approach each other. Differential signal Vlia has a waveform obtained by differentiating a change in potential due to the above-described reset by a time constant (corresponding to cut-off frequency fac=1.6 MHz) due to AC coupling.

Peak value Vpn changes from increase to decrease immediately after the start of reset of feedback circuit 15A by trigger signal TRIG, and changes at a discharge time constant, following negative-phase component Voutn. On the other hand, threshold Vth changes from decrease to increase immediately after the start of reset, and changes at a charge time constant, following positive-phase component Voutp. As a result, peak value Vpn immediately becomes equal to or smaller than threshold Vth, and signal LOS is switched from a high-level to a low-level (sending conditions of trigger signal TRIG is released).

In the section of state III, since differential input voltage Vint becomes 0 V, signal SD output from comparator circuit 57a is switched from a low-level to a high-level. Since switch signal generator circuit 57f does not delay the rise of signal SD (the delay time of OR circuit 85 is sufficiently small), switch signal SW changes from a low-level to a high-level without delay in response to signal SD switching from a low-level to a high-level. Accordingly, the time constant of feedback circuit 15A is set from time constant τ1 to time constant τ2. After trigger signal TRIG is maintained at a high-level for a time of time constant τd2 after the rise from a low-level to a high-level, trigger signal TRIG changes to a low-level, and the state of the feedback control changes from state III to state I.

In the section of state I immediately after the transition from state III, since differential input voltage Vin becomes 0 V, feedback circuit 15A performs an open loop control (high-speed control). Since the second burst optical signal has already been input to receiver 9, voltage signal Vtia decreases and differential input voltage Vin increases. As a result, electric charge is again stored in capacitor 55, so that differential input voltage Vint increases. However, in this case, even when differential input voltage Vint becomes 0 V or more, differential input voltage Vint does not exceed the hysteresis width of comparator circuit 57a, so that signal SD is maintained at a high-level, and switch signal SW is also maintained at a high-level. Accordingly, feedback circuit 15A maintains a state in which time constant is set to τ2.

The voltage value of reference voltage signal Vref may be set to the value of voltage signal Vtia when input current Iapd is a predetermined positive value. Accordingly, since the charging voltage of capacitor 55 does not become a positive value until input current Iapd becomes large to some extent, the feedback control is in a state (open loop control) in which bypass current Iaoc1 is not generated by feedback circuits 15 and 15A. In this case, feedback circuits 15 and 15A maintain state I until the next burst optical signal having a signal strength larger than a predetermined value is input to receiver 9.

For example, transimpedance amplifier 10 can respond to consecutive identical digits in state I for a burst optical signal having a signal strength smaller than a predetermined value. When a burst optical signal having a signal strength greater than a predetermined value is input to receiver 9, in response to the start of reception of the burst optical signal, transimpedance amplifier 10 generates bypass current Iaoc1 and switches the time constant from τ1 to τ2. As a result, the feedback control is maintained in state I (high-speed control). Differential signal Vlia maintains a waveform obtained by differentiating a change in potential due to the above-described reset by a time constant (corresponding to cut-off frequency fac=1.6 MHz) due to AC coupling, and is in a state (settling completed state) in which differential signal Vlia can be normally received by limiting amplifier 20 when time t is around 1.3 μsec.

Incidentally, when the second burst optical signal has a strength such that differential input voltage Vint exceeds the hysteresis width of comparator circuit 57a, switch signal SW is switched from a high-level to a low-level with a delay of time constant τd3 from the start of the second burst optical signal, as with the response after time t of 0.1 μsec in the first burst optical signal. As a result, while switch signal SW is maintained at a low-level, the settling of transimpedance amplifier 10 is completed in about several hundred nsec, and differential signal Vlia is brought into a state in which differential signal Vlia can be normally received by limiting amplifier 20. Thereafter, in transimpedance amplifier 10, the state of feedback control changes from state I to state II, and feedback circuit 15A performs a closed-loop control (low-speed feedback control).

As described above, even when there is no interval period between two consecutive burst optical signals, it is possible to remove the influence of the preceding burst optical signal (first burst optical signal) on each signal in transimpedance amplifier 10, to settle an offset control loop (feedback control loop) at a high speed, and to be brought into a state in which the subsequent burst optical signal (second burst optical signal) can be normally received in a short time.

As described above, in transimpedance amplifier 10, when the burst optical signal is input to receiver 9, input current Iapd is generated by photodiode PD. Since input current Iapd includes a DC component, a difference occurs between the mean value (DC component) of voltage signal Vtia and reference voltage signal Vref, and capacitor 55 is charged. Accordingly, the start of reception of the burst optical signal can be detected on the basis of the charging voltage (differential input voltage Vint) of capacitor 55. The time constants of feedback circuits 15 and 15A are maintained at time constant τ2 for a predetermined period (time constant τd3) after the start of reception of the burst optical signal is detected, and the time constant is switched from time constant τ2 to time constant τ1 larger than time constant τ2 after the elapse of a predetermined period. This makes it possible to generate bypass current Iaoc1 at a high speed at the start of the burst optical signal and to respond to the consecutive identical digits after a predetermined time has elapsed from the start of the burst optical signal.

While the burst optical signal is input to receiver 9, current signal Iin obtained by drawing bypass current Iaoc1 from input current Iapd in accordance with the burst optical signal is converted to voltage signal Vtia by TIA core 11, and differential signal Vout including positive-phase component Voutp and negative-phase component Voutn is generated by differential amplifier circuit 13 in accordance with the difference between voltage signal Vtia and reference voltage signal Vref. In response to the detection of the end of reception of the burst optical signal, electric charge stored in capacitor 55 is released, and the charging voltage (differential input voltage Vint) of capacitor 55 is reset. In this manner, the current value of bypass current Iaoc1 becomes a current value in an initial state immediately after the end of input of the burst optical signal to receiver 9. As a result, the time required for feedback circuits 15 and 15A to return to an initial state is shortened, and the interval period from the end of one burst optical signal to the start of the next burst optical signal can be shortened. As described above, even when the interval period from the end of one burst optical signal to the start of the next burst optical signal is short, the next burst optical signal can be normally received.

The time constant is set to time constant τ2 while the burst optical signal is not input to receiver 9. Therefore, when the burst optical signal is input to receiver 9, bypass current Iaoc1 can be generated in a time of time constant τ2 in accordance with the input of input current Iapd. Therefore, it is possible to shorten the time from the start of the reception of the burst optical signal until the value of bypass current Iaoc1 converges.

While the burst optical signal is not input to receiver 9, input current Iapd is zero. Therefore, since there is almost no difference between voltage signal Vtia and reference voltage signal Vref, the charging voltage (differential input voltage Vint) of capacitor 55 is substantially 0 V. Accordingly, it is considered that there is no need to reset the charging voltage of capacitor 55 at the start of the burst optical signal. In transimpedance amplifier 10, the charging voltage (differential input voltage Vint) of capacitor 55 is not reset when the start of the reception of the burst optical signal is detected. In other words, when the start of the reception of the burst optical signal is detected, capacitor 55 is maintained in a chargeable state. More specifically, capacitor 55 is maintained in a chargeable state for a period from the detection of the start of the reception of the burst optical signal to the detection of the end of reception of the burst optical signal. According to the configuration of the present embodiment, the circuit configuration of transimpedance amplifier 10 can be simplified because there is no need for a circuit for resetting the charging voltage of capacitor 55 at the start of reception of the burst optical signal.

While the burst optical signal is not input to receiver 9, there is almost no difference between voltage signal Vtia and reference voltage signal Vref in transimpedance amplifier 10, so that the charging voltage (differential input voltage Vint) of capacitor 55 is substantially 0 V. When the burst optical signal is input to receiver 9, input current Iapd is generated. Since input current Iapd includes a DC component, a difference occurs between the mean value (DC component) of voltage signal Vtia and reference voltage signal Vref, and capacitor 55 is charged. Therefore, by setting a threshold (second threshold) so that the charging voltage (differential input voltage Vint) of capacitor 55 becomes larger than the threshold (second threshold) after the start of reception of the burst optical signal, the start of the burst optical signal can be detected immediately after the start of the burst optical signal.

In detector circuits 57 and 57A, when comparator circuit 57a determines that differential input voltage Vint is larger than the threshold (0 V), switch signal generator circuits 57b and 57f generate switch signal SW that changes from a high-level to a low-level by delaying signal SD that changes from a high-level to a low-level by time constant $\tau d3$, and switch the time constant from time constant $\tau 2$ to time constant $\tau 1$ by the low-level switch signal SW. According to this configuration, the time constants of feedback circuits 15 and 15A can be switched from time constant $\tau 2$ to time constant $\tau 1$ after time constant $\tau d3$ elapses from the detection of the start of reception of the burst optical signal.

The burst optical signal includes high-level and low-level signals irregularly. Thus, while the burst optical signal is input to receiver 9, each of peak value Vpp of positive-phase component Voutp and peak value Vpn of negative-phase component Voutn that are output from level monitor circuit 41 is maintained substantially constant, and the difference between peak value Vpp and peak value Vpn is substantially constant. On the other hand, immediately after the end of the reception of the burst optical signal, the voltage value of negative-phase component Voutn is larger than the voltage value of positive-phase component Voutp. In detector circuit 14, peak value Vpp is detected in accordance with a charging voltage of capacitor 69 corresponding to positive-phase component Voutp, and peak value Vpn is detected in accordance with a charging voltage of capacitor 64 corresponding to negative-phase component Voutn. Therefore, when the state in which the voltage value of negative-phase component Voutn is larger than the voltage value of positive-phase component Voutp is continued, the difference between peak value Vpp and peak value Vpn changes from the difference during the input of the burst optical signal. Therefore, since the difference between peak value Vpp and peak value Vpn changes with the end of the burst optical signal, the end of the burst optical signal can be detected based on peak value Vpp and peak value Vpn.

By setting threshold Vth so that peak value Vpn becomes larger than threshold Vth corresponding to peak value Vpp after the end of the reception of the burst optical signal, the end of the burst optical signal can be detected immediately after the end of the burst optical signal.

Time constant $\tau d3$ is shorter than period Ts of the preamble signal. In this case, since the time constants of feedback circuits 15 and 15A are switched from time constant $\tau 2$ to time constant $\tau 1$ before the input of the preamble signal to receiver 9 is finished, it is possible to maintain a consecutive identical digits tolerance while the payload signal is input to receiver 9.

Feedback circuit 16 performs feedback control to differential amplifier circuit 13 in accordance with positive-phase component Voutp and negative-phase component Voutn to remove a DC offset of differential signal Vout. Therefore, since the DC offset generated in differential amplifier circuit 13 is removed from differential signal Vout, the end of the reception of the burst optical signal can be accurately detected by detector circuit 14.

Time constant $\tau 1$ may be set to a time constant corresponding to consecutive identical digits of a transmitted signal such as a 10G-EPON. By setting time constant $\tau 2$ to a value smaller than time constant $\tau 1$, it is possible to reduce an increase in a settling time of transimpedance amplifier 10. Since input current Iapd is not affected by bypass current Iaoc1 during an open loop control by feedback circuits 15 and 15A, time constant $\tau 2$ can be set to a high speed (small value).

The transimpedance amplifier according to the present disclosure is not limited to the above embodiments.

Transimpedance amplifier 10 may not include reference voltage generator circuit 12, and reference voltage signal Vref may be supplied to transimpedance amplifier 10 from an external reference voltage generator circuit. For example, reference voltage signal Vref may be supplied from a constant voltage source.

Differential amplifier circuit 13 may include one differential amplifier, or three or more differential amplifiers. The output terminal of feedback circuit 16 may be connected to the input terminal of differential amplifier 13a. Transimpedance amplifier 10 may not include feedback circuit 16.

Detector circuit 14 may include a circuit that can detect peak value Vpp and peak value Vpn on the basis of differential signal Vout, and that can generate threshold Vth.

Transimpedance amplifier 10 may have a configuration in which a state in which the voltage value of positive-phase component Voutp is larger than the voltage value of negative-phase component Voutn is continued due to the residual bypass current Iaoc1 after the end of reception of the burst optical signal. In this case, detector circuit 14 may include a configuration that detects the end of the burst optical signal upon detecting that peak value Vpp of positive-phase component Voutp is larger than the threshold corresponding to peak value Vpn of negative-phase component Voutn.

Transimpedance amplifier 10 may include, instead of feedback circuits 15 and 15A, a feedback circuit having functions equivalent to those of feedback circuits 15 and 15A and having a configuration different from feedback circuits 15 and 15A.

Feedback circuit 15 may include a single-output differential amplifier that outputs a single output signal instead of differential amplifier 51. Feedback circuit 15A may include a single-output OTA instead of OTA 51A. In these cases as well, switching of the time constant and generation of bypass current Iaoc1 may be performed.

The threshold of differential input voltage Vint for detecting the start of reception of the burst optical signal may not be 0 V. Comparator circuit 57a may compare differential input voltage Vint with the threshold to output a low-level signal SD when differential input voltage Vint is larger than the threshold and to output a high-level signal SD when differential input voltage Vint is smaller than or equal to the threshold.

What is claimed is:

1. A transimpedance amplifier configured to convert an input current generated by a photodetector in accordance with a burst optical signal to a differential signal including a positive-phase component and a negative-phase component and output the differential signal, the transimpedance amplifier comprising:
   an input terminal configured to receive the input current;
   a single-ended amplifier circuit having an input node that is electrically connected to the input terminal, the single-ended amplifier circuit being configured to convert a current signal input to the input node to a voltage signal;
   a first feedback circuit having a time constant, the first feedback circuit being configured to generate a bypass current at a response speed adjusted by the time constant;

a differential amplifier circuit configured to generate the differential signal in accordance with a difference between the voltage signal and a reference voltage signal; and a first detector circuit configured to detect an end of the burst optical signal based on the differential signal, wherein the first feedback circuit includes a capacitor, generates the bypass current in accordance with a charging voltage of the capacitor based on the difference between the voltage signal and the reference voltage signal, and subtracts the bypass current from the input current, wherein the first feedback circuit detects a start of the burst optical signal based on the charging voltage, maintains the time constant at a first time constant for a predetermined period from the detection of the start of the burst optical signal, and, upon an elapse of the predetermined period, switches the time constant from the first time constant to a second time constant that is larger than the first time constant, and wherein the first detector circuit resets the charging voltage of the capacitor by releasing electric charge stored in the capacitor in response to the detection of the end of the burst optical signal.

2. The transimpedance amplifier according to claim 1, wherein the time constant is set to the first time constant while the burst optical signal is not input.

3. The transimpedance amplifier according to claim 1, wherein the capacitor is maintained at a chargeable state in a case where the start of the burst optical signal is detected.

4. The transimpedance amplifier according to claim 1, wherein the first detector circuit detects the end of the burst optical signal based on a first peak value of the positive-phase component and a second peak value of the negative-phase component.

5. The transimpedance amplifier according to claim 4, wherein the first detector circuit includes a single-phase peak-hold circuit configured to detect the second peak value and a threshold generator circuit configured to generate a first threshold for detecting the end of the burst optical signal in accordance with the first peak value, and wherein the first detector circuit detects the end of the burst optical signal in response to the second peak value exceeding the first threshold.

6. The transimpedance amplifier according to claim 1, wherein the first feedback circuit further includes a second detector circuit configured to detect the start of the burst optical signal, and wherein the second detector circuit detects the start of the burst optical signal in response to the charging voltage exceeding a second threshold for detecting the start of the burst optical signal.

7. The transimpedance amplifier according to claim 6, wherein the second detector circuit includes a comparator circuit configured to output a detection signal indicating that the charging voltage is larger than the second threshold, and a switch signal generator circuit configured to generate a switch signal for switching the time constant between the first time constant and the second time constant based on the detection signal, and wherein, in a case where the comparator circuit determines that the charging voltage is larger than the second threshold, the switch signal generator circuit generates the switch signal by delaying the detection signal by the predetermined period and switches the time constant from the first time constant to the second time constant using the switch signal.

8. The transimpedance amplifier according to claim 1, wherein the burst optical signal includes a preamble signal and a payload signal following the preamble signal, and wherein the predetermined period is shorter than a period of the preamble signal.

9. The transimpedance amplifier according to claim 1, further comprising a second feedback circuit configured to control the differential amplifier circuit in accordance with feedback of both the positive-phase component and the negative-phase component to remove a direct current (DC) offset in the differential signal.

* * * * *